United States Patent
Khoshkava et al.

(10) Patent No.: US 10,409,379 B1
(45) Date of Patent: Sep. 10, 2019

(54) HAPTIC ACTUATOR ASSEMBLY HAVING A MAGNETIC PRE-LOAD DEVICE

(71) Applicant: IMMERSION CORPORATION, San Jose, CA (US)

(72) Inventors: Vahid Khoshkava, Montreal (CA); Juan Manuel Cruz Hernandez, Montreal (CA); Kaniyalal Shah, Fremont, CA (US)

(73) Assignee: IMMERSION CORPORATION, San Jose, CA (US)

( * ) Notice: Subject to any disclaimer, the term of this patent is extended or adjusted under 35 U.S.C. 154(b) by 0 days.

(21) Appl. No.: 16/010,169

(22) Filed: Jun. 15, 2018

(51) Int. Cl.
*B06B 1/02* (2006.01)
*B06B 1/06* (2006.01)
*G06F 3/01* (2006.01)

(52) U.S. Cl.
CPC ............ *G06F 3/016* (2013.01); *B06B 1/0238* (2013.01); *B06B 1/0688* (2013.01); *B06B 2201/56* (2013.01)

(58) Field of Classification Search
CPC ..... G06F 3/016; B06B 1/0238; B06B 1/0688; B06B 2201/56
USPC .......... 340/407.1, 407.2; 310/14; 273/148 R; 341/20
See application file for complete search history.

(56) References Cited

U.S. PATENT DOCUMENTS

| 6,002,184 A | * | 12/1999 | Delson | ................... | H02K 23/00 |
| | | | | | 273/148 R |
| 8,981,914 B1 | * | 3/2015 | Stetten | ................... | A61B 42/10 |
| | | | | | 340/407.1 |

OTHER PUBLICATIONS

"Piezo Haptic Actuator, PowerHap™ 2.5G Type Preliminary Data" pp. 1-9.
"PowerHap™ Piezo actuators with haptic feedback, Technologies & Products Press Conference 2016" pp. 1-16.

* cited by examiner

*Primary Examiner* — Daryl C Pope
(74) *Attorney, Agent, or Firm* — Medler, Ferro, Woodhouse & Mills PLLC

(57) ABSTRACT

A haptic actuator assembly comprising a haptic actuator and a pre-load device is presented. The haptic actuator is configured to generate a displacement along a first axis, wherein the haptic actuator is a piezoelectric actuator. The pre-load device is adjacent to the haptic actuator and configured to generate a compressive load on the haptic actuator along the first axis. The pre-load device includes a first component and a second component that are disposed on opposing surfaces of the haptic actuator, and are configured to generate a magnetic force that attracts the first component and the second component to each other in order to generate the compressive load on the haptic actuator along the first axis. The first component is a permanent magnet, and the second component is at least one of another permanent magnet, an electromagnet, or a ferromagnetic component that comprises ferromagnetic material.

22 Claims, 16 Drawing Sheets

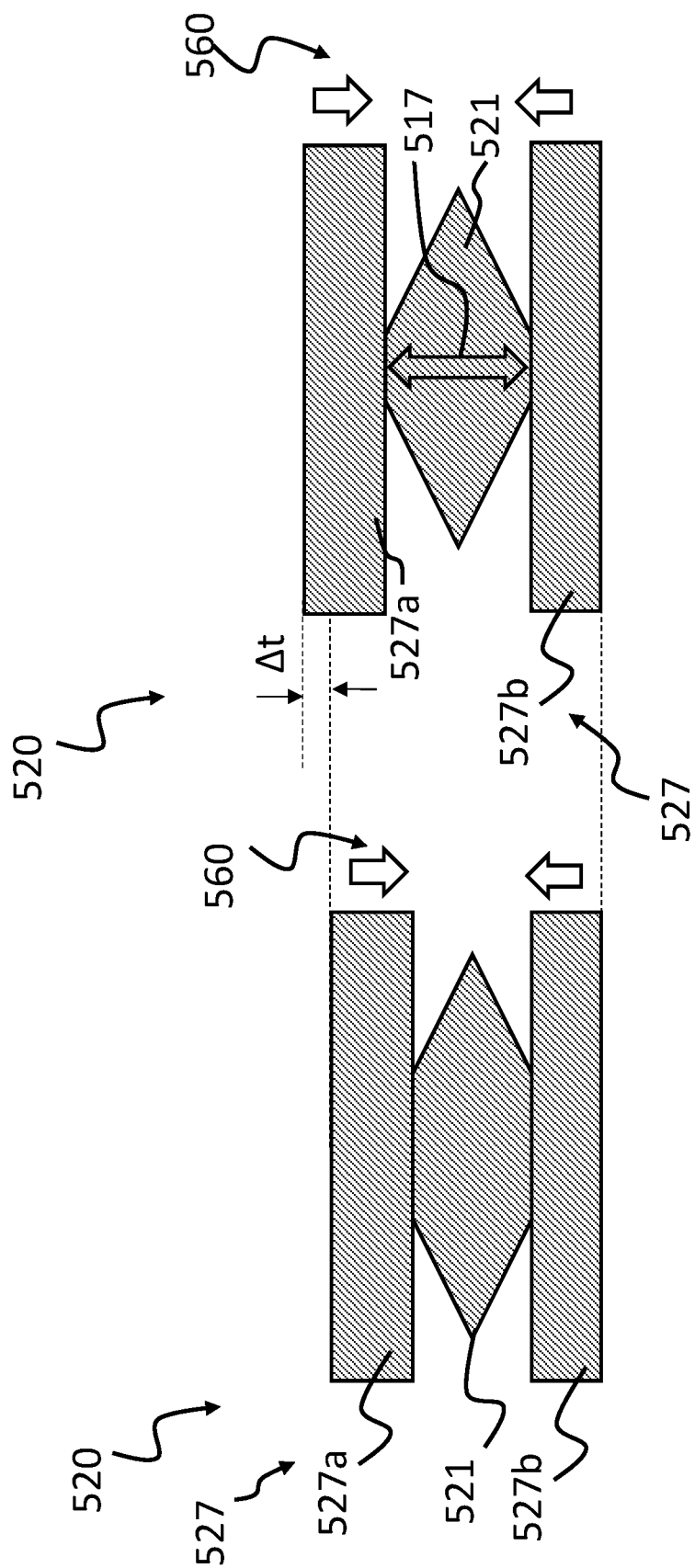

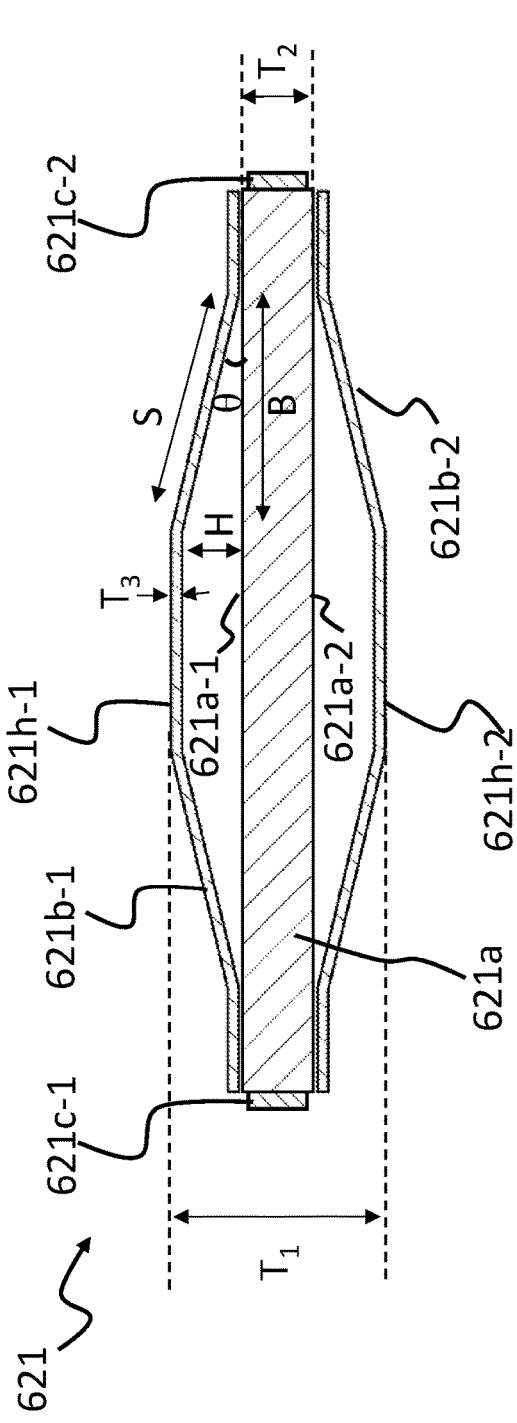
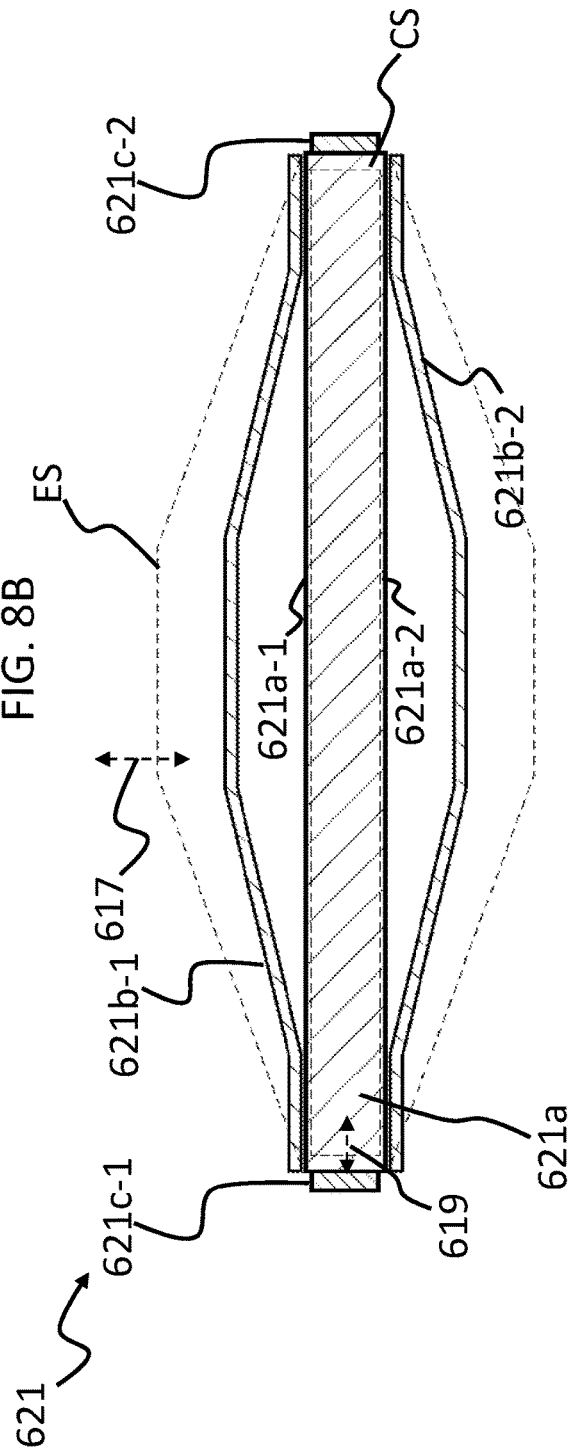
FIG. 8B
FIG. 8C

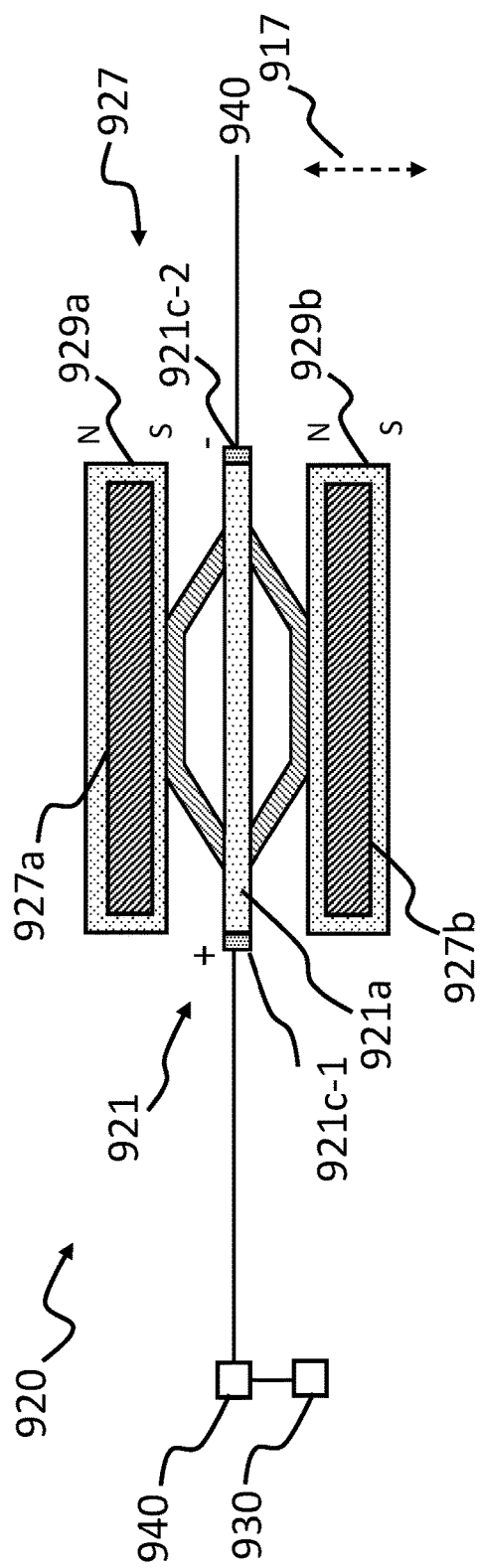
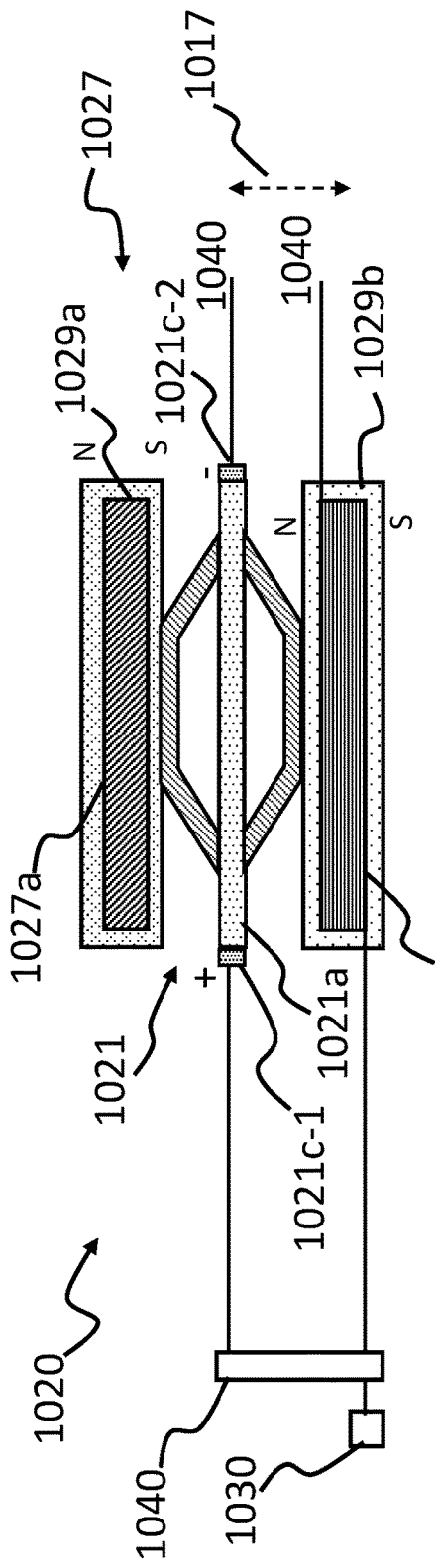
FIG. 11A
FIG. 11B

HAPTIC ACTUATOR ASSEMBLY HAVING A MAGNETIC PRE-LOAD DEVICE

FIELD OF THE INVENTION

The present invention is directed to a haptic actuator assembly with a magnetic pre-load device that has application in gaming, consumer electronics, automotive, entertainment, and other industries.

BACKGROUND

Haptics provide a tactile and force feedback technology that takes advantages of a user's sense of touch by applying haptic effects, such as forces, vibrations, and other motions to a user. Devices such as mobile devices, tablet computers, and handheld game controllers can be configured to generate haptic effects. Haptic effects can be generated with haptic actuators, such as an eccentric rotating mass (ERM) actuator or a linear resonant actuator (LRA). The haptic effects may include a vibrotactile haptic effect that provides a vibration at a surface or other portion of such devices.

SUMMARY

One aspect of the embodiments herein relates to a haptic actuator assembly, comprising a haptic actuator and a pre-load device. The haptic actuator is configured to generate a displacement along a first axis, wherein the haptic actuator is a piezoelectric actuator. The pre-load device is adjacent to the haptic actuator and configured to generate a compressive load on the haptic actuator along the first axis, and includes a first component and a second component that are disposed on opposing surfaces of the haptic actuator, and are configured to generate a magnetic force that attracts the first component and the second component to each other in order to generate the compressive load on the haptic actuator along the first axis. The first component is a permanent magnet, and the second component is at least one of another permanent magnet, an electromagnet, or a ferromagnetic component that comprises ferromagnetic material.

One aspect of the embodiments herein relates to a haptic actuator assembly, comprising: a haptic actuator and a pre-load device. The haptic actuator includes a layer of piezoelectric material configured to generate strain along a parallel axis, the parallel axis being parallel to a planar surface of the layer, and includes a displacement conversion device configured to convert the strain of the layer of piezoelectric material along the parallel axis to expansion or contraction of the haptic actuator along a perpendicular axis, the perpendicular axis being perpendicular to the planar surface of the layer. The expansion or contraction of the haptic actuator is configured to generate a displacement of the haptic actuator along the perpendicular axis. The pre-load device is adjacent to the haptic actuator and is configured to generate a compressive load on the haptic actuator along the perpendicular axis, and includes a first component and a second component that are disposed on opposing surfaces of the haptic actuator, and are configured to generate a magnetic force that attracts the first component and the second component to each other in order to generate the compressive load on the haptic actuator along the perpendicular axis. The first component is a permanent magnet, and the second component is at least one of another permanent magnet, an electromagnet, or a ferromagnetic component that comprises ferromagnetic material.

One aspect of the embodiments herein relates to a haptic-enabled device, comprising a housing, a power source, and a haptic actuator assembly configured to generate a haptic effect at an outer surface of the housing, the haptic actuator assembly comprising a haptic actuator and a pre-load device. The haptic actuator includes a layer of piezoelectric material configured to generate strain along a parallel axis, the parallel axis being parallel to a planar surface of the layer, at least two electrodes attached to or embedded within the layer of piezoelectric material, and a displacement conversion device configured to convert the strain of the layer of piezoelectric material along the parallel axis to expansion or contraction of the haptic actuator along a perpendicular axis, the perpendicular axis being perpendicular to the planar surface of the layer, wherein the expansion or contraction of the haptic actuator is configured to generate a displacement of the haptic actuator along the perpendicular axis. The pre-load device is adjacent to the haptic actuator and configured to generate a compressive load on the haptic actuator along the perpendicular axis, the pre-load device including a first component and a second component that are disposed on opposing surfaces of the haptic actuator, and are configured to generate a magnetic force that attracts the first component and the second component to each other in order to generate the compressive load on the haptic actuator along the perpendicular axis. The first component is a permanent magnet, and the second component is at least one of another permanent magnet, an electromagnet, or a ferromagnetic component that comprises ferromagnetic material. The haptic-enabled device further comprises a control unit configured to control the power source to provide power to the at least two electrodes of the haptic actuator.

BRIEF DESCRIPTION OF THE DRAWINGS

The foregoing and other features, objects and advantages of the invention will be apparent from the following detailed description of embodiments hereof as illustrated in the accompanying drawings. The accompanying drawings, which are incorporated herein and form a part of the specification, further serve to explain the principles of the invention and to enable a person skilled in the pertinent art to make and use the invention. The drawings are not to scale.

FIGS. 7A and 7B depict a haptic actuator assembly with a haptic actuator and a pre-load device, according to an embodiment hereof.

FIGS. 8A-8E depict an example haptic actuator for a haptic actuator assembly, according to an embodiment hereof.

FIG. 11A depicts a haptic actuator assembly having a pre-load device comprising two permanent magnets, according to an embodiment hereof.

FIG. 11B depicts a haptic actuator assembly having a pre-load device comprising a permanent magnet and an electromagnet, according to an embodiment hereof.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

One aspect of the embodiments herein relates to providing a magnetic pre-load device for a haptic actuator assembly. The haptic actuator assembly may include a haptic actuator, such as a piezoelectric actuator, that is configured to output displacement (e.g., strain or other deformation) and force. In one example, the displacement may be used to generate a vibrotactile haptic effect, by oscillating between a first displacement value and a second displacement value. The magnetic pre-load device may be configured to generate a pre-load on the haptic actuator that constrains the displacement provided by the haptic actuator. The constraint may still allow the haptic actuator to output displacement, but reduces an amplitude of the displacement relative to a situation in which the magnetic pre-load device is absent. In some instances, the displacement may take the form of strain that causes the haptic actuator to expand along a particular axis, and the pre-load generated by the magnetic pre-load device may be a compressive load that opposes expansion of the haptic actuator along that axis. In some instances, the pre-load may be a load that is independent of user interaction or influences that are external to the haptic actuator assembly. In other words, the pre-load may be a load that is, e.g., built into the haptic actuator assembly or internal to the haptic actuator assembly. The pre-load may constrain a displacement from the haptic actuator, an amount of change in the displacement of the haptic actuator, or a combination thereof.

Figure 12:
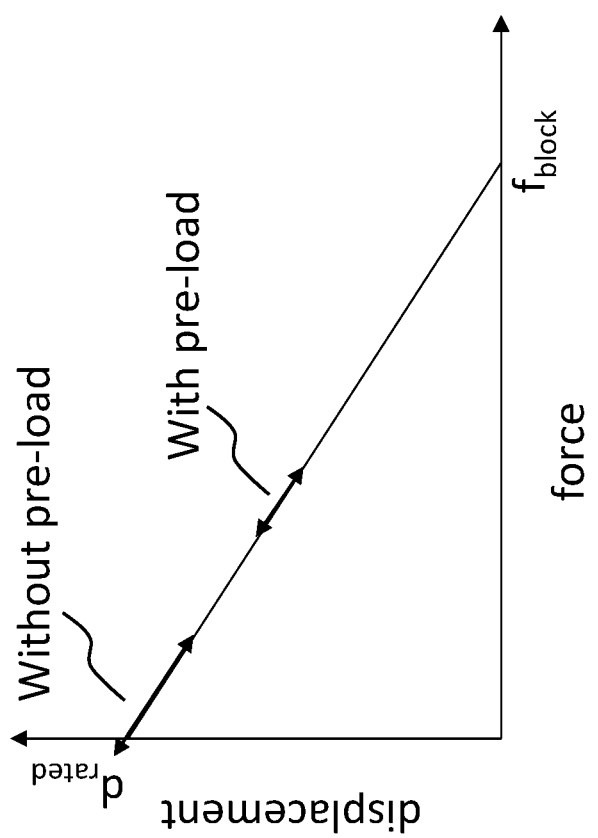
FIG. 12 provides a graph that depicts an example relationship between force that is output by a haptic actuator and displacement that is output by the haptic actuator, according to an embodiment hereof.

In an embodiment, the magnetic pre-load device may constrain or otherwise oppose displacement from the haptic actuator in order to prevent a force that is also output by the haptic actuator from becoming too weak. For instance, the haptic actuator may have a force-displacement profile like that in FIG. 12, in which the haptic actuator outputs less force as it outputs more displacement, and vice versa. If no pre-load is applied to the haptic actuator when the haptic actuator is driven with a drive signal or other stimulus, the haptic actuator may in some instances output a displacement that is equal to a rated displacement $d_{rated}$ (also referred to as nominal displacement) that is associated with the haptic actuator and with an amplitude of the drive signal. For instance, the haptic actuator may be a piezoelectric actuator. When a drive signal is applied to the piezoelectric actuator, the piezoelectric actuator may output a strain along a particular axis that is equal to a rated displacement (e.g., rated strain). When the amount of displacement provided by the haptic actuator is equal to the rated displacement, however, the displacement may be accompanied by little to no force. For example, FIG. 12 illustrates a situation in which a haptic actuator outputs a displacement that oscillates in value near a rated displacement of the haptic actuator (e.g., as a result of being driven by an oscillating drive signal). The haptic actuator may output such displacement because of an absence of a pre-load or of an external load. The oscillating displacement may translate into a vibrotactile haptic effect, but the vibrotactile haptic effect may be accompanied by only a small amount of force, as depicted in FIG. 12. As a result, the vibrotactile haptic effect may be perceived by a user as being very weak, or may not be perceived at all.

FIG. 12 further illustrates another situation in which a haptic actuator generates displacement in the presence of a pre-load. The displacement in both situations in FIG. 12 may be generated by the same signal amplitude or the same drive signal. In an embodiment, the pre-load may constrain the displacement from the haptic actuator to a value that is a fraction (e.g., ½, ¾) of its rated displacement. As an example, the pre-load may constrain displacement that is output by the haptic actuator such that the displacement is reduced from 35 μm (when the pre-load is absent) to 1 μm (when the pre-load is present). By decreasing the displacement, the pre-load can cause an increase in the force output by the haptic actuator. As a result, if a vibrotactile haptic effect is generated by a haptic actuator assembly that includes the pre-load, the force accompanying the vibrotactile haptic effect may be stronger and more perceivable relative to the situation in which the vibrotactile haptic effect is generated by a haptic actuator having no pre-load.

In an embodiment, the magnetic pre-load device may constrain or otherwise oppose displacement from the haptic actuator in order to protect the haptic actuator. For instance, a haptic actuator that includes piezo ceramic material may be brittle and thus may suffer cracking or other damage from excessive strain or other displacement. In such an instance, a magnetic pre-load device in accordance herewith may constrain a range of motion of the haptic actuator by constraining its displacement, and thus may guard against the haptic actuator suffering damage associated with excessive strain.

In an embodiment, the magnetic pre-load device generates a pre-load via a magnetic force(s). The magnetic force(s) may, e.g., generate a compressive load that opposes expansion of a haptic actuator of the haptic actuator assembly along one or more axes of motion. In some cases, the magnetic force(s) may be generated by a pair of permanent magnets disposed on opposite sides (or, more generally, opposite ends) of the haptic actuator, such that the haptic actuator is sandwiched between the two permanent magnets. The permanent magnets may be oriented so that a pole of one magnet (e.g., N pole) faces an opposite pole of another magnet (e.g., S pole), in order to generate magnetic attraction between the permanent magnets. Because the haptic actuator is sandwiched between the two permanent magnets, the magnetic attraction may act as a compressive load that opposes expansion of the haptic actuator. In an embodiment, the permanent magnets may be able to generate a strong magnetic force(s) while remaining small in size. For example, each of the permanent magnets may have a thickness that is less than a millimeter, or only a few millimeters.

In other embodiments, the magnetic force(s) may be generated by a permanent magnet and an electromagnet. The electromagnet may be formed by, e.g., a conductive coil that is configured to generate a magnetic field when an electrical current or other drive signal is passed through the coil. In some instances, a strength of the electromagnet may be varied in order to vary an amount of pre-load that is applied to a haptic actuator. In an embodiment, the electromagnet may be selectively activated or deactivated. The electromagnet may be activated to provide the pre-load on the haptic actuator while a drive signal is being applied to a haptic actuator, or more generally when a haptic effect is being provided. When the drive signal to the haptic actuator ends, the haptic actuator may still undergo some residual oscillation (e.g., residual vibration) due to inertia of various components of the haptic actuator. The electromagnet may be deactivated to provide a braking effect on the residual oscillation. The braking effect may dampen or otherwise decrease a force accompanying the residual oscillation, and/or a displacement or other movement of the residual oscillation. The force accompanying the residual oscillation may be dampened or otherwise decreased when the electromagnet is deactivated, because deactivating the electromagnet removes a pre-load on the haptic actuator. When the pre-load is removed, the residual oscillation may have a higher displacement value but a lower force relative to a situation in which the pre-load is present. As a result with the pre-load removed, the residual oscillation may be perceived by a user as being weak, or may be imperceptible to the user. In an embodiment, the displacement or other movement of the residual oscillation may be dampened or otherwise reduced when the electromagnet is deactivated, because the electromagnet may be formed by a conductive coil. The conductive coil may act as an energy harvester that absorbs kinetic energy from the residual oscillation and converts the kinetic energy to electrical energy. In an embodiment, the energy harvesting functionality of the conductive coil may be used independently of and apart from any braking function.

In other embodiments, the magnetic force(s) for the magnetic pre-load device may be generated by a permanent magnet and a ferromagnetic component, such as a layer of ferromagnetic material. The ferromagnetic material may be, e.g., iron, cobalt, nickel, or an alloy of such materials. In some cases, the magnetic force(s) may be generated by a pair of electromagnets.

In an embodiment, a haptic actuator assembly having the magnetic pre-load device may be disposed at a location at which the haptic actuator assembly will experience little to no external load. For instance, the haptic actuator assembly may be disposed at a back side of a mobile phone, such as on an inner surface of a back panel of the mobile phone. The back panel may have a low mass (e.g., less than 1 g), and may exert less than 1 N of external load on the haptic actuator assembly. In such a situation, the magnetic pre-load device may advantageously provide a pre-load to constrain displacement of a haptic actuator of the assembly.

Figure 1:
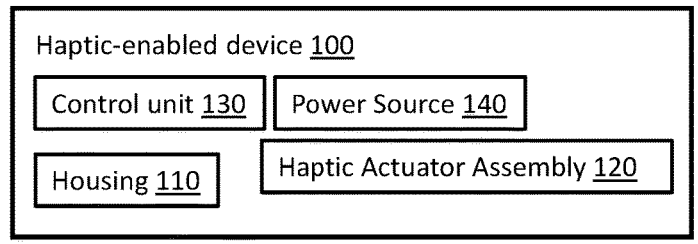
FIG. 1 depicts a block diagram of a haptic-enabled device having a haptic actuator assembly, according to an embodiment hereof.

FIG. 1 depicts a block diagram of a haptic-enabled device 100 that may include a haptic actuator assembly 120 that incorporates a pre-load device. More specifically, the haptic-enabled device 100 includes a housing 110, the haptic actuator assembly 120, a control unit 130, and a power source 140. In an embodiment, the haptic-enabled device 100 may be a user interface device such as a mobile phone, tablet computer, laptop, handheld game controller, wearable device (e.g., haptic-enabled electronic watch, glove, or head-mounted device) or any other user interface device.

In an embodiment, the power source 140 may include a battery or other energy storage device that is configured to provide power for the haptic actuator assembly 120 to generate a haptic effect (the terms power and energy are used interchangeably herein). In an embodiment, the control unit 130 may be configured to control the power source 140 to drive a haptic actuator, which is described below in more detail, of the haptic actuator assembly 120. For instance, the control unit 130 may be configured to control the power source 140 to generate a drive voltage signal or a drive current signal to be applied to the haptic actuator of the haptic actuator assembly 120. The power source 140 may be configured to generate a drive signal for the haptic actuator of the haptic actuator assembly 120 that has an amplitude in a range of 50 V to 100 V (e.g., a 60 V drive signal).

In an embodiment, the control unit 130 may be dedicated to controlling the generating of haptic effects on the haptic-enabled device 100, or may be a general purpose control unit that controls other operations on the haptic-enabled device 100. In an embodiment, the control unit 130 may include one or more microprocessors, one or more processing cores, a programmable logic array (PLA), a field programmable gate array (FPGA), an application specific integrated circuit (ASIC), or any other processing circuit.

Figures 2A, 2B:
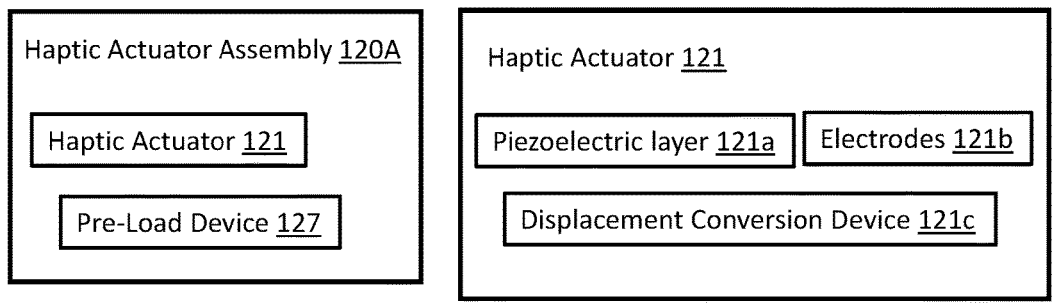
FIGS. 2A and 2B depict block diagrams of a haptic actuator assembly and a haptic actuator, according to embodiments hereof.

FIG. 2A illustrates a block diagram of a haptic actuator assembly 120A that is an embodiment of the haptic actuator assembly 120. The haptic actuator assembly 120A includes a haptic actuator 121 and a pre-load device 127. The pre-load device 127 is described below in more detail. In an embodiment, the pre-load device may be configured to generate a compressive load that is in a range of 2 N to 4 N. In an embodiment, the haptic actuator 121 is configured to output displacement and force along a particular axis. For instance, the haptic actuator 121 may be a piezoelectric actuator, or an electroactive polymer (EAP) actuator, such as an EAP actuator that includes polyvinylidene difluoride (PVDF). In an embodiment, the haptic actuator 121 may be configured to exhibit strain or other deformation that expands or shrinks the haptic actuator along one or more axes.

FIG. 2B depicts a block diagram of an embodiment of the haptic actuator 121. In the embodiment of FIG. 2B, the haptic actuator 121 includes a piezoelectric layer 121a (also referred to as a layer of piezoelectric material or a sheet of piezoelectric material), electrodes 121b, and a displacement conversion device 121c. The piezoelectric layer 121a may be connected to the electrodes 121b, and may be configured to output strain along one or more axes when a drive signal is applied to the electrodes 121b. In some cases, the piezoelectric layer 121a may include a stack of sub-layers of piezoelectric material, wherein each of the sub-layers is directly sandwiched between two electrodes of the electrodes 121b. In other cases, the piezoelectric layer 121a has only one such sub-layer.

In an embodiment, the displacement conversion device 121c may be configured to convert strain or other displacement that is along a first axis (e.g., an x-axis) to displacement that is along a second axis (e.g., a z-axis). In an embodiment, the first axis may be a parallel axis, wherein the parallel axis is parallel to a planar surface of the piezoelectric layer 121a.

In an embodiment, the second axis may be a perpendicular axis, wherein the perpendicular axis is perpendicular to the planar surface of the piezoelectric layer 121a. In some cases, the displacement conversion device 121c may be a displacement amplification device that is configured to amplify a displacement along the first axis (e.g., Δx) to a greater displacement (e.g., Δz) along the second axis.

Figures 3A, 3B:
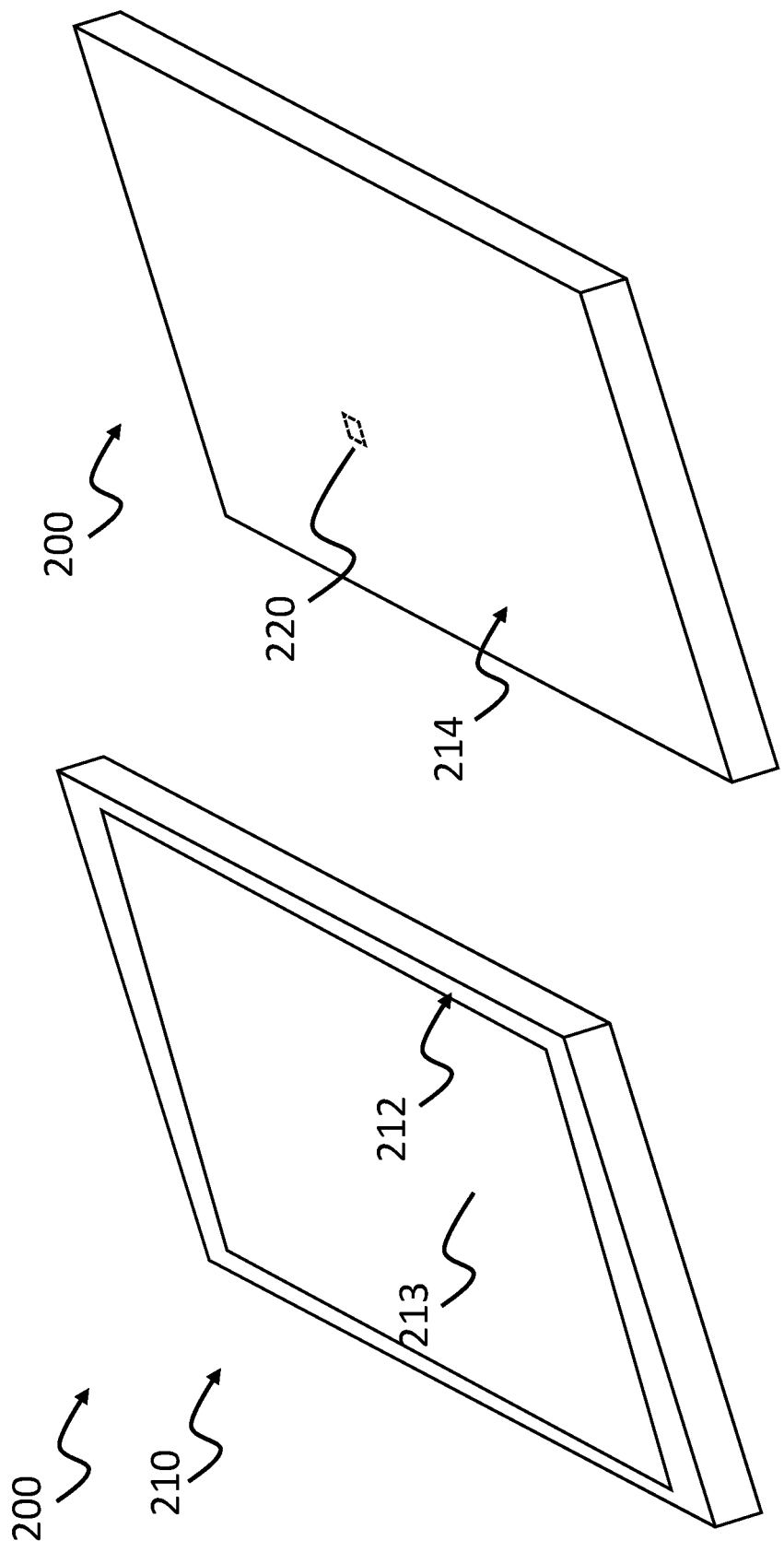
FIGS. 3A and 3B depict a haptic-enabled device and a haptic actuator assembly disposed on a back side of the haptic-enabled device, according to an embodiment hereof.

FIGS. 3A and 3B depict a haptic-enabled device 200 that is an embodiment of the haptic-enabled device 100. The haptic-enabled device 200 may be, e.g., a mobile phone or a tablet computer. The haptic-enabled device 200 may comprise a housing 210 that is formed by at least a front panel 212 and a back panel 214. The front panel 212 may form a front side of the housing 210, and may incorporate a touch screen device 213, such as a liquid crystal display (LCD) or light emitting display (LED) that has capacitive or resistive touch sensors. The back panel 214 may form a back side of the housing 210. The front side of the housing 210 may be a side that generally faces a user during use, while the back side is disposed opposite of, or opposing, the front side of the housing 210.

Figure 4:
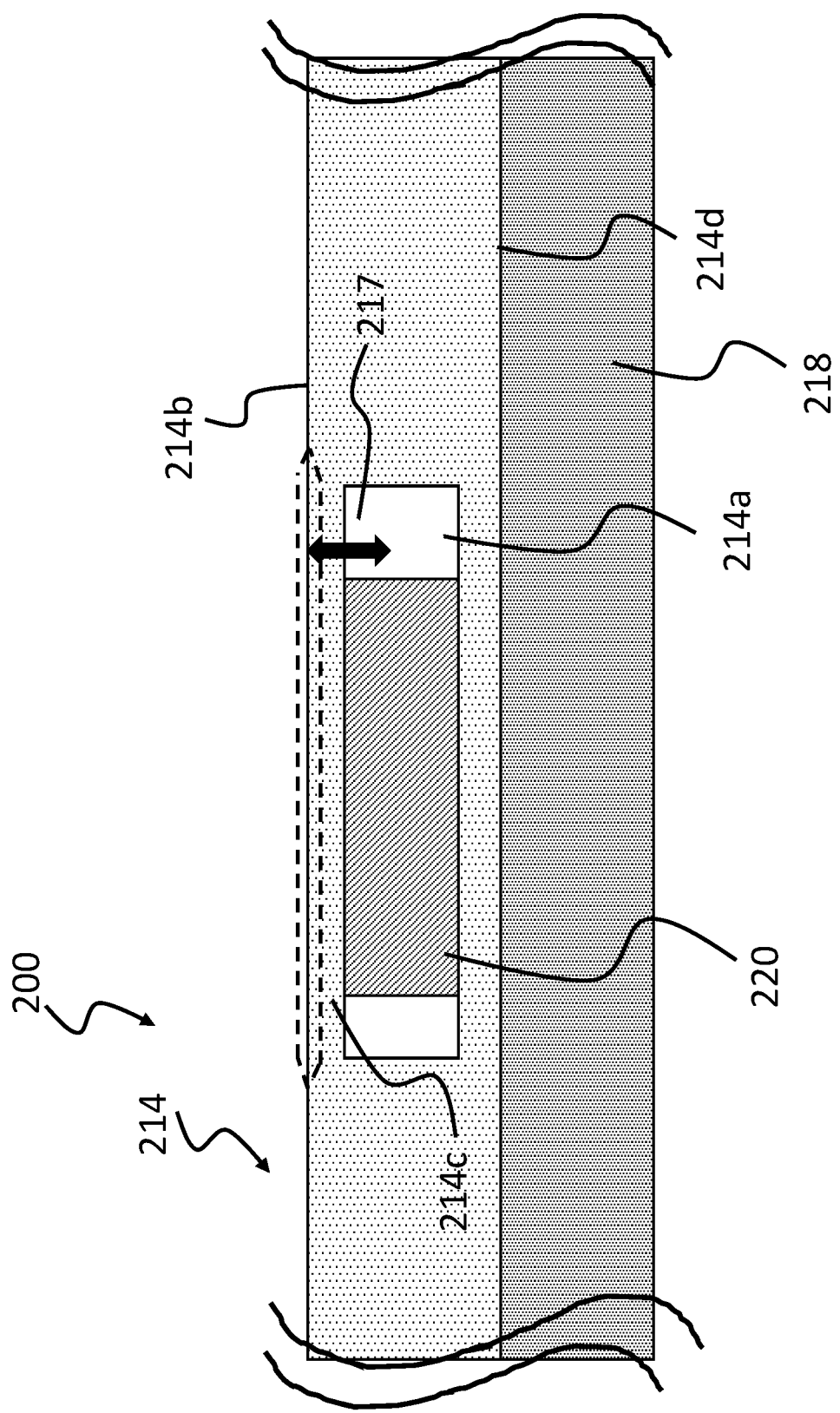
FIG. 4 depicts a haptic actuator assembly disposed within a back panel of a housing of a haptic actuator assembly, according to an embodiment hereof.

As illustrated in FIG. 3B, the haptic-enabled device 200 further includes a haptic actuator assembly 220. In some embodiments, the haptic actuator assembly 220 is disposed within the back panel 214, or on an inner surface or outer surface of the back panel 214. For instance, FIG. 4 depicts an embodiment in which the back panel 214 has a cavity 214a, and the haptic actuator assembly 220 is embedded within the back panel 214 by being disposed within the cavity 214a. The haptic actuator assembly 220 may be configured to, e.g., generate a vibrotactile haptic effect at an outer or exterior surface 214b of the back panel 214. The vibrotactile haptic effect may be generated when the haptic actuator assembly repeatedly expands and contracts along an axis 217 in FIG. 4 at a certain frequency in order to output an oscillating displacement (also referred to as oscillating vibration or oscillating movement) along the axis 217. More generally speaking, the vibrotactile haptic effect may be generated when the haptic actuator assembly generates a time-varying amount of displacement, such as a displacement that oscillates in value at a particular frequency. When the haptic actuator assembly 220 is outputting displacement, it may press against, or pull on, a sub-layer 214c of the back panel 214. The sub-layer 214c may be of a material having a suitable Young's modulus and may be sufficiently thin to be able to undergo elastic bending or other elastic deformation as a result of being acted upon by the haptic actuator assembly 220, such as by being pressed or pulled by the assembly. In other words, the sub-layer 214c of the back panel 214 may be configured to have a stiffness that permits it to bend inward and outward relative to a remainder of the back panel 214, as illustrated by the dashed lines in FIG. 4, to generate a vibrotactile haptic effect.

As discussed in more detail below, the haptic actuator assembly 220 may include a pre-load device that constrains expansion by the haptic actuator assembly along an axis, such as the axis 217. The sub-layer 214c, or more generally the back panel 214, may by itself lack sufficient stiffness to constrain expansion of the haptic actuator assembly 220. For instance, any compressive load applied to the haptic actuator assembly 220 by the sub-layer 214c, or more generally by the back panel 214, may be less than 1 N. More generally speaking, any compressive load applied to the haptic actuator assembly 220 by the housing 210 may be less than 1 N. In some cases, the housing may apply no compressive load on the haptic actuator assembly 220. In such a situation, the absence of a pre-load may allow an amount of displacement that is output from the haptic actuator of the haptic actuator assembly to be excessive, wherein the excessive displacement may reduce a force of the vibrotactile haptic effect at the outer surface 214b and may increase a risk of damage to the haptic actuator of the haptic actuator assembly 220. Thus, a pre-load device in accordance herewith may be advantageous in such an application to constrain displacement along the axis 217 of the haptic actuator assembly 220, and particularly displacement of its haptic actuator along the axis 217.

In an embodiment, a displacement that is output by the haptic actuator assembly 220 may be generated by a haptic actuator of the haptic actuator assembly. For instance, if a haptic actuator of the haptic actuator assembly 220 expands by 5 μm along the axis 217, such that the haptic actuator is outputting a displacement of 5 μm, the haptic actuator assembly 220 may also expand by 5 μm, such that the haptic actuator assembly 220 is also outputting 5 μm of displacement. Accordingly, the amount of displacement by the haptic actuator and the amount of displacement by the haptic actuator assembly 220 may be the same, or may be different.

In an embodiment, a force that is output by the haptic actuator assembly 220, such as a force exerted against the sub-layer 214c, may be equal to a force generated by a haptic actuator of the assembly 220 minus a force of any pre-load. For instance, the haptic actuator assembly 220 may generate a pre-load of 4 N. The pre-load may be a compressive load against the haptic actuator that causes, or results in, the haptic actuator generating a force that is about 20 N. In some instances, a force that is output by the haptic actuator assembly may be about 16 N.

In an embodiment, the haptic-enabled device 200 illustrated in FIG. 4 may further include a rigid component 218 that is disposed on an inner surface 214d of the back panel 214. More specifically, the rigid component 218 may be in contact with the inner surface 214d. The rigid component 218 may channel displacement from the haptic actuator assembly 220 toward the outer surface 214b of the back panel 214, rather than toward the inner surface 214d. More specifically, the rigid component 218 may be incompressible along the axis 217, such that when the haptic actuator of the haptic actuator assembly 220 expands along the axis 217, the sub-layer 214c provides much less resistance against that expansion than does the rigid component 218. As a result, most or all of the expansion of the haptic actuator of the assembly 220 may be channeled toward bending the sub-layer 214c, rather than toward compressing the rigid component 218. Examples of the rigid component 218 may include a metal frame, a printed circuit board (PCB) substrate, or a rigid battery shell.

Figure 5:
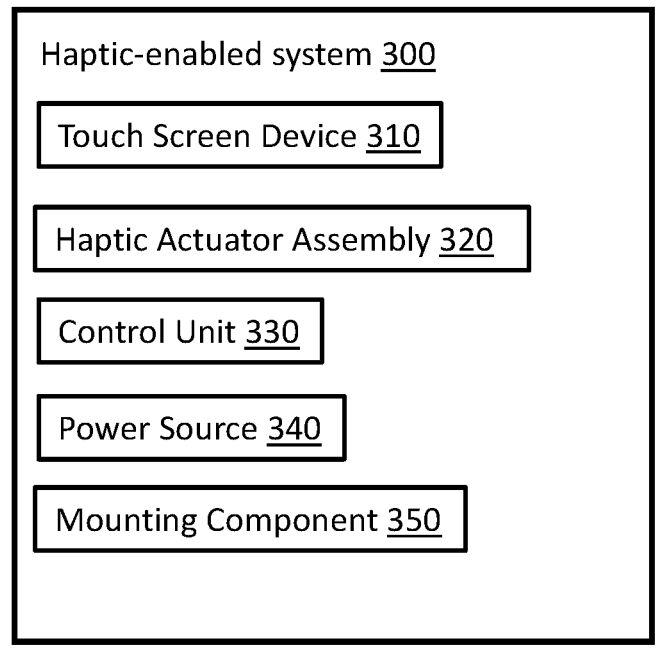
FIG. 5 depicts a block diagram of a haptic-enabled system that includes a touch screen device, a haptic actuator assembly, and a mounting component, according to an embodiment hereof.

In an embodiment, a haptic actuator assembly of the embodiments herein may be part of a haptic-enabled system, such as the haptic-enabled system 300 of FIG. 5. In an embodiment, the haptic-enabled system 300 may be a center console system for providing various in-vehicle functionality, including displaying navigation instructions, providing entertainment options, and displaying sensor data. In an embodiment, the haptic-enabled system 300 includes a touch screen device 310, a haptic actuator assembly 320, a control unit 330, a power source 340, and a mounting component 350. The control unit 330 may be similar to the control unit 130 of FIG. 1, and the power source 340 may be similar to the power source 140. The touch screen device 310 may be, for instance, a capacitive or resistive LCD or LED touch screen configured to receive touch input.

Like the haptic actuator assembly 120 or 220, the haptic actuator assembly 320 may be configured to output displacement and force to generate a haptic effect at the touch screen device 310. The haptic actuator assembly 320 may include a pre-load device to constrain displacement so that a sufficient amount of force accompanies the displacement. The touch screen device 310 may be directly or indirectly connected to a mounting component 350. In an embodiment, the mounting component 350 may be part of a body of a vehicle's center console.

Figure 6:
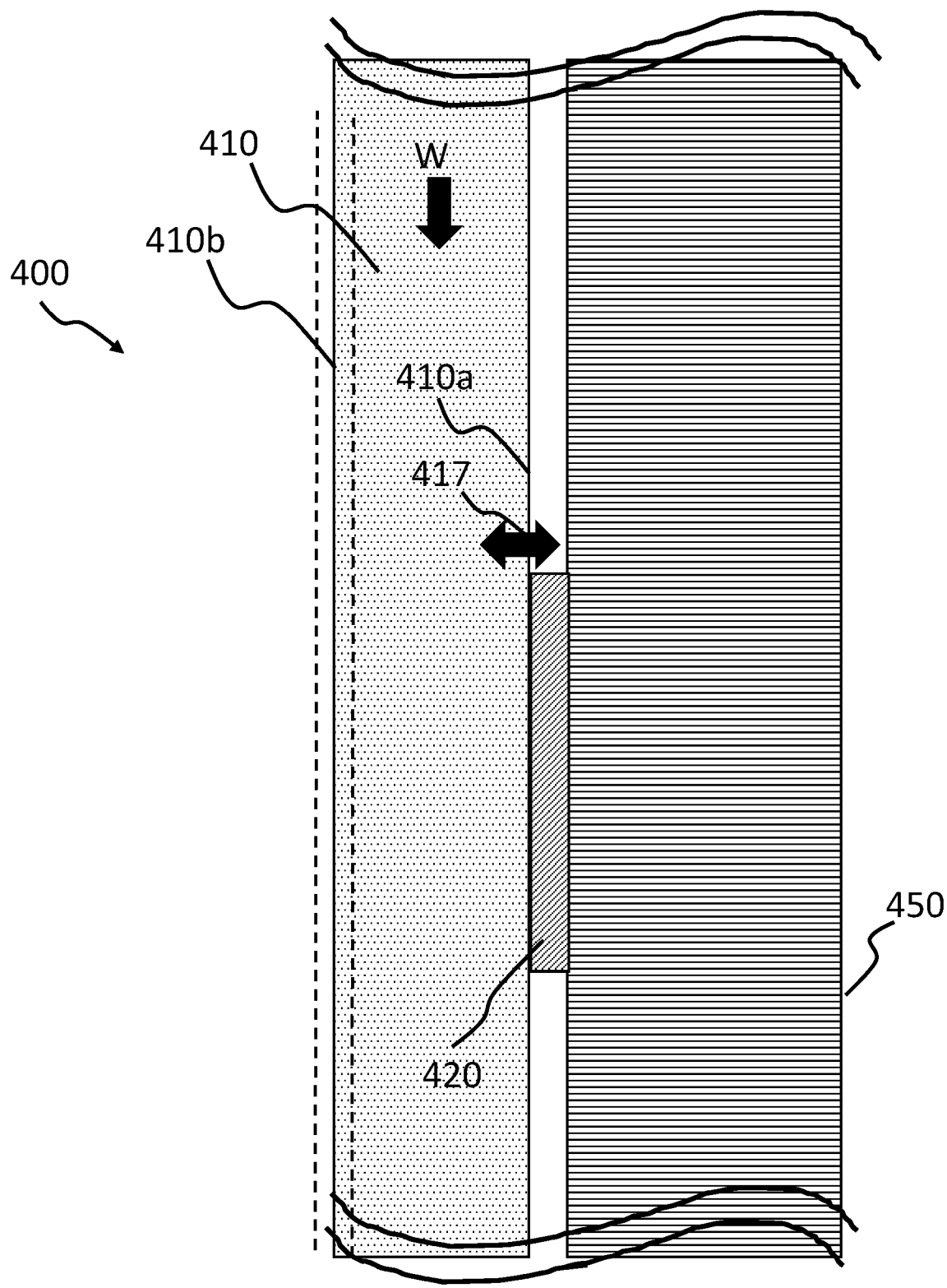
FIG. 6 depicts a haptic-enabled system that includes a touch screen device, a haptic actuator assembly, and a mounting component, according to an embodiment hereof.

FIG. 6 depicts a haptic-enabled system 400 that is an embodiment of the haptic-enabled system 300. The haptic-enabled system 400 includes a touch screen device 410, a haptic actuator assembly 420, and a mounting component 450. In an embodiment, the touch screen device 410 may have a mass of less than 10 g. The haptic actuator assembly 420 may be configured to output displacement along an axis 417. As a result, the haptic actuator assembly 420 may press/push and pull against a surface 410a of the touch screen device 410 to generate a vibrotactile haptic effect at an exterior surface 410b of the touch screen device 410. The surface 410b may be a front exterior surface facing a driver, while the surface 410a may be an opposite surface of the touch screen device 410. In an embodiment, the mounting component 450 may be a rigid component, and may have substantially more mass than the touch screen device 410, such that most or all of the displacement that is output by the haptic actuator assembly 420 is directed toward moving the touch screen device 410, rather than toward moving the mounting component 450. In an embodiment, the touch screen device 410 may be connected to the mounting component 450 via the haptic actuator assembly 420. In an embodiment, the touch screen device 410 may be connected to the mounting component 450 via a suspension that allows the touch screen device 410 to move along the axis 417.

In an embodiment, the haptic actuator assembly 420 may include a pre-load device that constrains expansion of the haptic actuator assembly 420 along the axis 417. In the embodiment of FIG. 6, a weight W of the touch screen device 410 may not provide sufficient load by itself to provide a sufficient compressive load on the haptic actuator assembly 420 along the axis 417. As depicted in FIG. 6, the weight W may be insufficient because it is too low in magnitude (because the mass of the touch screen device 410 is low), and/or the weight W is acting in a direction that is partially or completely perpendicular to the axis 417. In such an application, a pre-load device in accordance herewith may be incorporated into the haptic actuator assembly 420 in order to constrain the expansion of the haptic actuator assembly.

An embodiment of a haptic actuator assembly 520 is illustrated in FIGS. 7A and 7B. The haptic actuator assembly 520 includes a haptic actuator 521 and a pre-load device 527. As depicted in FIG. 7B, the haptic actuator 521 may be configured to output displacement along an axis 517 by expanding along the axis 517. The displacement that is output by the haptic actuator 521 may become the displacement that is output by the haptic actuator assembly 520 as a whole. In an embodiment, the axis 517 may represent a thickness dimension of the haptic actuator assembly 520, and the displacement that is output by the haptic actuator assembly 520 may refer to a change in a thickness, or Δt, of the haptic actuator assembly 520 relative to, e.g., a baseline state in which the haptic actuator 521 was not activated. In an embodiment, the haptic actuator 521 may be a piezoelectric actuator.

In an embodiment, the pre-load device 527 includes at least a first component 527a and a second component 527b that are configured to generate a pre-load, which may be in the form of a compressive load, as represented by arrows 560 in FIGS. 7A and 7B, opposing expansion along the axis 517 of the haptic actuator 521 and of the haptic actuator assembly 520. The haptic actuator 521 is sandwiched or otherwise disposed between the first component 527a and the second component 527b. In an embodiment, the first component 527a and the second component 527b may be attached to opposing sides of the haptic actuator 521 via an adhesive or some other manner of attachment. In an embodiment, the first component 527a and the second component 527b may be held in contact or in close proximity to opposing sides of the haptic actuator 521 without being fixedly attached thereto. In some cases, the compressive load may be generated by a force or forces that attract the first component 527a and the second component 527b to each other. As discussed below in more detail, the pre-load device 527 may be a magnetic pre-load device configured to generate a magnetic force(s) that attracts the first component 527a and the second component 527b to each other.

Figure 8A:
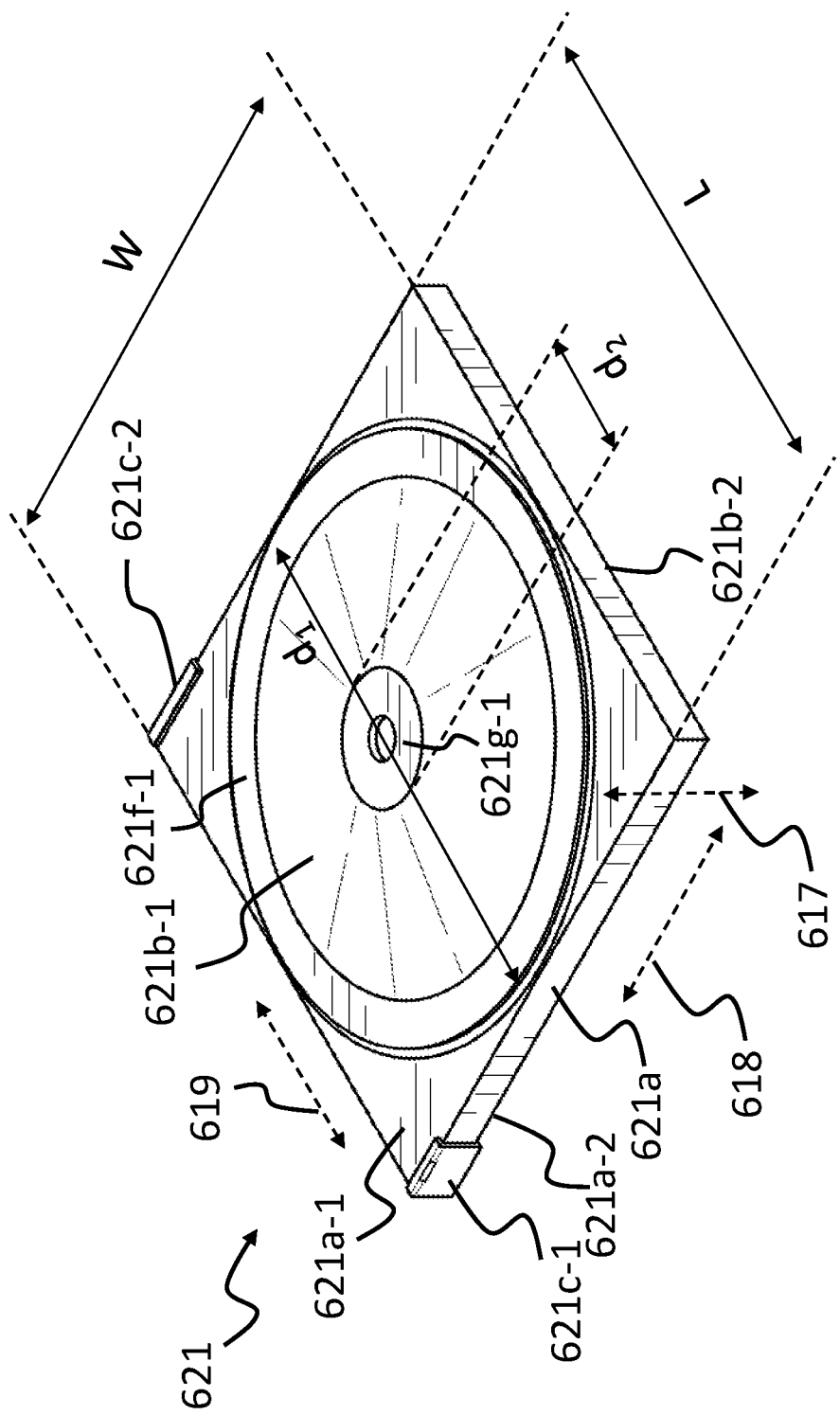

FIGS. 8A-8D illustrate a haptic actuator 621 that is an embodiment of the haptic actuator 521. In this embodiment, the haptic actuator 621 is a piezoelectric actuator that includes a layer 621a of piezoelectric material configured to generate a strain along an axis, such as axis 618 and/or axis 619, that is parallel to a planar surface (e.g., 621a-1 or 621a-2) of the layer 621a. In an embodiment, the layer 621a of piezoelectric material may have a length L that is in a range of 9 mm to 25 mm, a width W that is in a range of 9 mm to 25 mm, and a thickness $T_2$ (see FIG. 8B) that is in a range of 0.3 mm to 2 mm. In an embodiment, as depicted in FIG. 8A, the length L and the width W of the layer 621a may both be equal to each other. In an embodiment, the layer 621a of piezoelectric material is a layer of lead zirconate titanate (PZT) or other piezo ceramic material. In an embodiment, the layer 621a of piezoelectric material is a layer of polymer. In an embodiment, as illustrated in FIG. 8B, the haptic actuator 621 may have an overall thickness $T_1$ that is in a range of 1 mm to 4 mm. In an embodiment, the haptic actuator 621 may be a version of the TDK® Power-Hap™ piezo actuator, such as the Miniaturized PowerHap™ 2.5G type of haptic actuator from TDK®.

As illustrated in FIGS. 8A-8C, the haptic actuator 621 further includes a displacement conversion device 621b-1/621b-2 that is configured to convert strain along an axis, such as axis 618 or axis 619, to expansion or contraction of the haptic actuator 621 along an axis 617, which is perpendicular to the planar surface (e.g., surface 621a-1 or 621a-2) of the layer 621a of piezoelectric material. The axis 618 or 619 may be referred to as a parallel axis, while the axis 617 may be referred to as a perpendicular axis. In an embodiment, the displacement that is output by the haptic actuator 621 along the axis 617 may arise from the expansion or contraction of the haptic actuator 621 along the axis 617.

In an embodiment, the displacement conversion device 621b-1/621b-2 is a displacement amplification device configured to convert a displacement, i.e., a first amount of displacement, caused by the strain along the axis 618 or axis 619, to a greater amount of displacement, i.e., a second amount of displacement, along the axis 617, wherein the second displacement is greater than the first displacement (see FIG. 8C). The displacement that is output by the haptic actuator 621 along a particular axis may refer to, e.g., a change in a dimension of the haptic actuator 621 along that axis (e.g., change in length, width, or thickness) relative to a baseline state in which the haptic actuator 621 was not activated.

In an embodiment, the displacement amplification device includes a lever device that is configured to perform the conversion from the first displacement to the second displacement. For instance, the displacement conversion device 621b-1/621b-2 in FIGS. 8A-8C is a lever device that includes a first disc 621b-1 and a second disc 621b-2 disposed on opposite sides or opposing surfaces of the layer 621a of piezoelectric material. Each disc of the first disc 621b-1 and second disc 621b-2 may be, e.g., a metal sheet (also referred to as a metal layer) that tapers from a circular base portion (e.g., 621f-1) to a circular central portion (e.g., 621g-1) to form a truncated cone with a respective planar surface 621a-1/621a-2 of the layer 621a of piezoelectric material. The truncated cone may also be referred to as a cymbal or a truncated conical endcap. As illustrated in FIG. 8B, the truncated cone may have a sloped portion with a slope length S, wherein the sloped portion may form an angle θ with a planar surface (e.g., 621a-1) of the layer 621a of piezoelectric material. In some cases, the angle θ may have a value of less than 45° (e.g., 15°). The sloped portion may create a height H for the truncated cone. The height H may be equal to or substantially equal to a height of the first disc 621b-1 and/or of the second disc 621b-2, and may be in a range of, e.g., 0.2 mm to 0.7 mm. If the sloped portion were projected onto the planar surface 621a-1, it may further have a base width B. Further, each disc of the first disc 621b-1 and the second disc 621b-2 may have a thickness $T_3$ (see FIG. 8B) that is a range of 0.1 mm to 0.5 mm. As depicted in FIG. 8A, the circular base portion (e.g., 621f-1) of each of the discs 621b-1, 621-b2 may have a diameter $d_1$ that is in a range of 9 mm to 12 mm, while the circular central portion (e.g., 621g-1) of each of the discs 621b-1, 621b-2 may have a diameter $d_2$ that is in a range of 2 mm to 3 mm. The values of the dimensions discussed above are only examples, and the various dimensions presented above may have other values.

In an embodiment, the haptic actuator 621 may interface with other components (e.g., with a pre-load device) via a surface of the displacement conversion device 621b-1/621b-2. For instance, the haptic actuator 621 may interface with the pre-load device via an outer surface 621h-1 of a circular central portion (e.g., 621g-1) of disc 621b-1, and/or with an outer surface 621h-2 of a circular central portion (e.g., 621g-1) of disc 621b-2. The outer surface 621h-1 and the outer surface 621h-2 may form opposite outer surfaces (also referred to as opposing outer surfaces) of the haptic actuator 621, and may act as a first interface surface and a second interface surface, respectively, for the haptic actuator 621. In such an embodiment, a pre-load device may include a first component and a second component that are disposed on the respective opposite surfaces of the haptic actuator 621. In some cases, a layer of adhesive may be applied on the outer surfaces 621h-1, 621h-2 to adhere them to a first component and a second component of a pre-load device.

In an embodiment, as illustrated in FIGS. 8B and 8C, the haptic actuator 621 further includes electrodes 621c-1 and 621c-2. When a voltage difference is created between the electrodes 621c-1 and 621c-2, the layer 621a of piezoelectric material may output strain along the axis 618 and/or the axis 619. For instance, the layer 621a of piezoelectric material may contract along the axis 619 to a contracted state CS indicated by the dashed lines in FIG. 8C. In an embodiment, the layer 621a of piezoelectric material may also experience some strain along the axis 617, but to a much lesser degree than the strain along the axis 619. In an embodiment, the strain of the layer 621a along the axis 619 may be in a range of 5 μm to 50 μm, while the strain of the layer 621a along the axis 617 may be in a range of 0.5 μm to 2 μm. In an embodiment, the layer 621a may also generate strain along the axis 618. The strain along the axis 619 and the strain along the axis 618 may be the same, or may differ. The displacement conversion device 621b-1/621b-2 in FIG. 8C may convert the strain along the axis 619 to expansion of the haptic actuator 621 along the axis 617 to an expanded state ES indicated by the dashed lines in FIG. 8C. The displacement that is output by the haptic actuator 621 may come from the expansion of the haptic actuator 621.

Figure 8D:
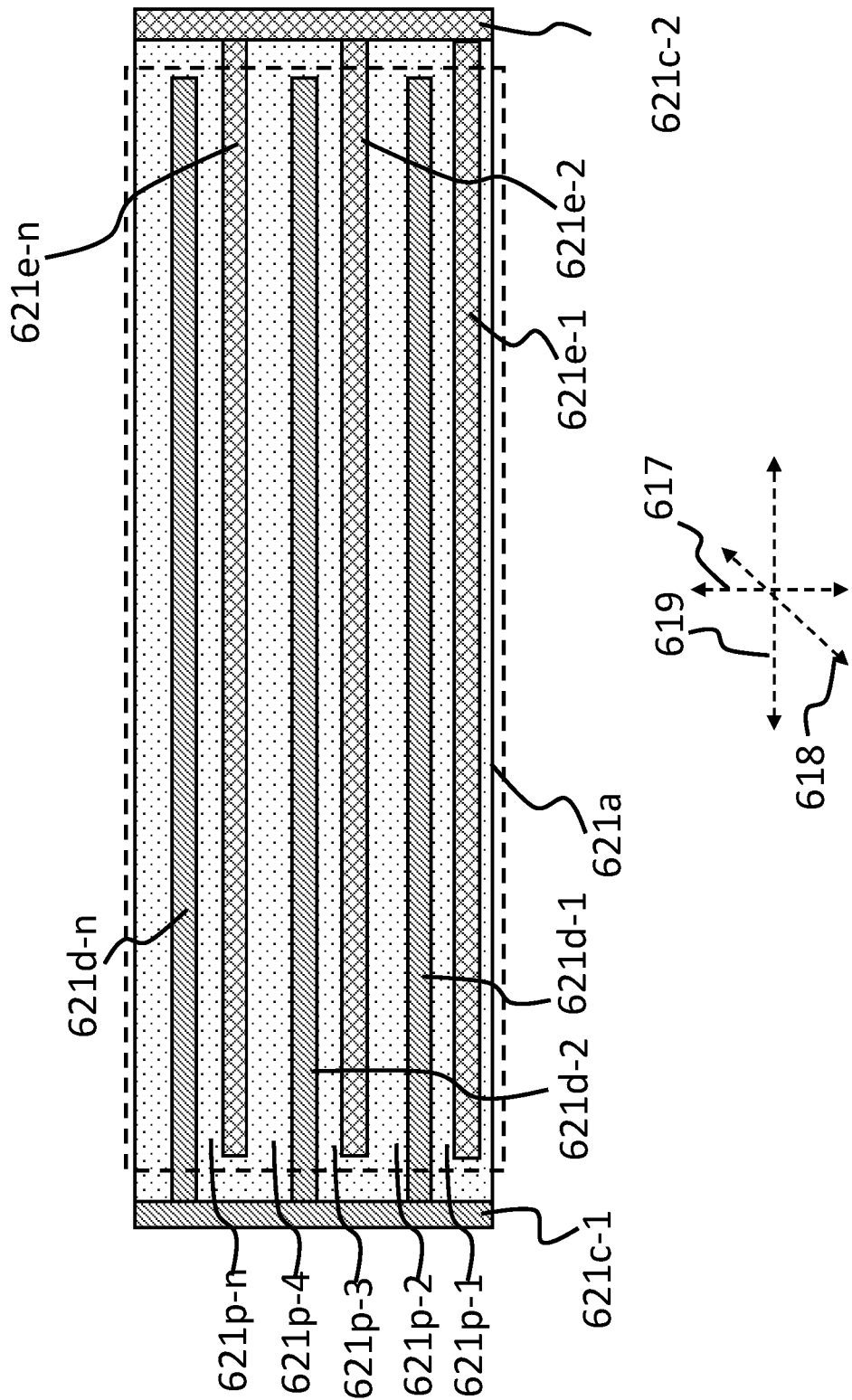

FIG. 8D illustrates an embodiment of the layer 621a of piezoelectric material that includes a stack of sub-layers 621p-1, 621p-2, 621p-3, 621p-4 . . . 621p-n of piezoelectric material. Further, the electrode 621c-1 and the electrode 621c-2 may form an inter-digitated or comb-like pattern. This pattern may reduce a distance between the two electrodes, which may allow a stronger electric field to be created between them. More specifically, the electrode 621c-1 may include a first set of electrode layers 621d-1, 621d-2 . . . 621d-n that are embedded within the layer 621a of piezoelectric material. Each electrode layer of the first set of electrode layers 621d-1 . . . 621d-n may extend substantially through a length or width of the layer 621a. Similarly, the electrode 621c-2 may include a second set of electrode layers 621e-1, 621e-2 . . . 621e-n that are also embedded within the layer 621a of piezoelectric material. Each electrode layer of the second set of electrode layers 621e-1 . . . 621e-n may extend substantially through the length or width of the layer 621a.

In an embodiment, each sub-layer of the plurality of sub-layers 621p-1 . . . 621p-n may be disposed directly between one of the first set of electrode layers 621d-1 . . . 621d-n and one of the second set of electrode layers 621e-1 . . . 621e-n, such that the two electrode layers are immediately adjacent to the sub-layer. For instance, the sub-layer 621p-1 is disposed directly between the electrode layer 621d-1 and the electrode layer 621e-1, wherein the electrode layer 621d-1 and the electrode layer 621e-1 are immediately adjacent to the sub-layer 621p-1.

In an embodiment, when a voltage difference is created between any electrode layer of the first set of electrode layers 621d-1 . . . 621d-n and a corresponding or adjacent electrode layer of the second set of electrode layers 621e-1 . . . 621e-n, the voltage difference may generate an electric field between the two electrode layers. The electric field may be aligned along the axis 617. In an embodiment, the axis 617 may be parallel with a poling direction of the piezoelectric material of each sub-layer of the plurality of sub-layers 621p-1 . . . 621p-n. In an embodiment, the poling direction of the piezoelectric material may be parallel with each sub-layer of the plurality of sub-layers 621p-1 . . . 621p-n, or more generally may be parallel with the layer 621a. For instance, the poling direction may be parallel with a length dimension or a width dimension of the layer 621a. The electric field along the axis 617 between the two electrode layers may cause a sub-layer of piezoelectric material between them to generate strain. The strain may be along one or more of the axes 617-619. For instance, FIG. 8D depicts the sub-layers 621p-1 . . . 621p-n contracting along the axis 619 and expanding along the axis 617, as indicated by the dashed lines in the figure. The amount of strain along the axis 619 may be based on a value of a $d_{31}$ coefficient of the piezoelectric material, while the amount of strain along the axis 617 may be based on a value of a $d_{33}$ coefficient of the piezoelectric material. In an embodiment, the amount of strain along the axis 619 may be considerably larger than the amount of strain along the axis 617.

Figure 8E:
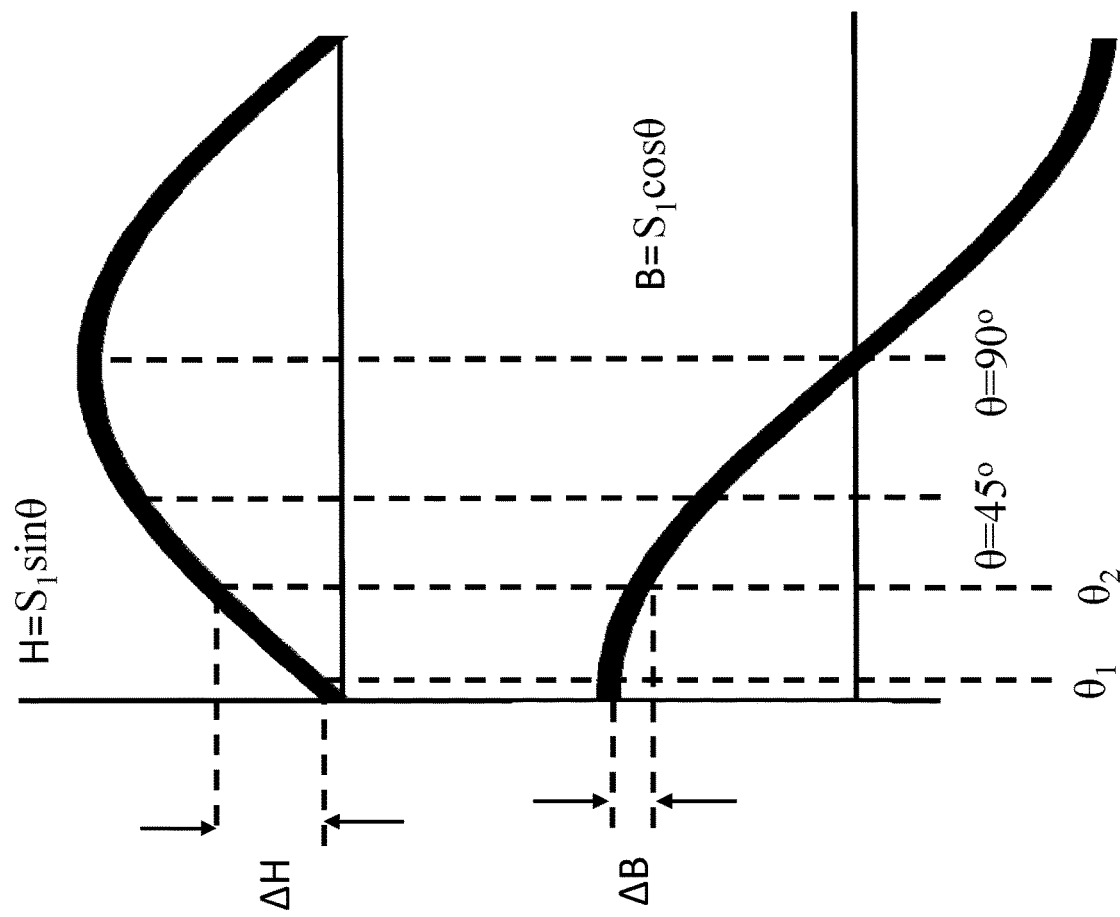

As stated above, the displacement conversion device 621*b*-1/621*b*-2 may be configured to convert the strain along the axis 619 to displacement and force along the axis 617. In an embodiment, the displacement conversion device 621*b*-1/621*b*-2 may form a plurality of linkages that are connected by joints (e.g., living hinges), and a geometry of the linkages may cause the strain along the axis 619 to be converted, and in some cases amplified, to displacement along the axis 617. For instance, FIG. 8B depicts a geometry that involves the dimensions S, H, and B, which are discussed above with respect to FIG. 8B. These dimensions may correspond to dimensions of a right triangle. As depicted in FIGS. 8B and 8C, when there is strain along the axis 619, the layer 621*a* of piezoelectric material may decrease in length or width, to the contracted state CS. As a result, the dimension B may decrease, which may force the angle θ to increase. The increase in θ may in turn increase the dimension H. The dimension S may remain the same, such as at a value of $S_1$, as θ changes. In this situation, because the dimensions of S (which equals $S_1$), B, and H correspond to those of a right triangle, the value of B may be calculated as $S_1 \cos θ$, while the value of H may be calculated as $S_1 \sin θ$. FIG. 8E illustrates a plot of H and B for such a situation, in which strain along the axis 619 of FIG. 8C causes a change in B (i.e., ΔB) and a change in H (i.e., ΔH). The quantity ΔB may represent a displacement along the axis 619, while the quantity ΔH may represent a displacement along the axis 617. As depicted in FIGS. 8B, 8C, and 8E, a strain that contracts the layer 621*a* to the contracted state CS may force the angle θ to increase, from $θ_1$ to $θ_2$. In FIG. 8E, both $θ_1$ to $θ_2$ are less than 45°. In such an embodiment, the increase in θ may result in a greater ΔH relative to ΔB. In other words, FIG. 8E demonstrates that a geometry such as that in FIGS. 8B and 8C may result in displacement along the axis 617 being amplified relative to displacement along the axis 619.

Figure 9:
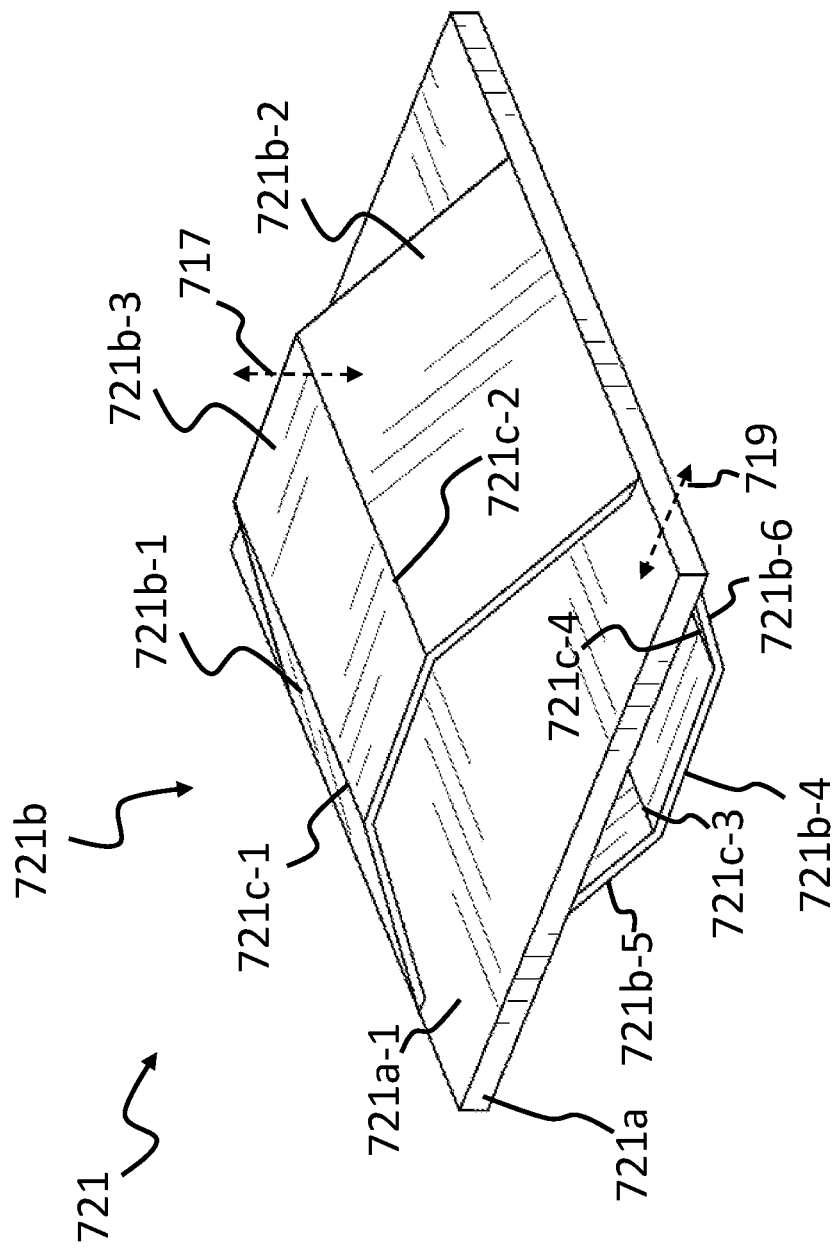
FIG. 9 depicts an example haptic actuator for a haptic actuator assembly, according to an embodiment hereof.

FIG. 9 depicts a haptic actuator 721 that is an embodiment of the haptic actuator 521. Like the haptic actuator 621, the haptic actuator 721 includes a layer 721*a* piezoelectric material. The haptic actuator 721 further includes a displacement conversion device 721*b* that is configured to generate strain along an axis 719 that is parallel to a planar surface 721*a*-1 of the layer 721*a* to displacement along an axis 717. Axis 719 may be referred to as a parallel axis, while axis 717 may be referred to as a perpendicular axis. As depicted in FIG. 9, the displacement conversion device 721*b* may form a frame that includes a pair of linkages 721*b*-1, 721*b*-2 that each acts as a lever to amplify displacement along the axis 719 to a greater amount of displacement along the axis 717. The pair of linkages 721*b*-1, 721*b*-2 may be connected to a center portion 721*b*-3 by a pair of respective living hinges 721*c*-1, 721*c*-2. The frame may also include a pair of linkages 721*b*-5, 721*b*-6 that also act as levers to amplify displacement along the axis 719 to a greater amount of displacement along the axis 717. The pair of linkages 721*b*-5, 721*b*-6 may be connected to a center portion 721*b*-4 by another pair of respective living hinges 721*c*-3, 721*c*-4. The center portions 721*b*-3 and 721*b*-4 may, e.g., act as respective interface surfaces for the haptic actuator 721, and may in some cases act as respective opposing outer surfaces of the haptic actuator 721. Displacement conversion and amplification devices are also discussed in U.S. Pat. No. 9,866,149 (IMM539), entitled "Method and Apparatus for Enabling Floating Touch Screen Haptics Assemblies," the entire content of which is incorporated herein by reference.

Figure 10:
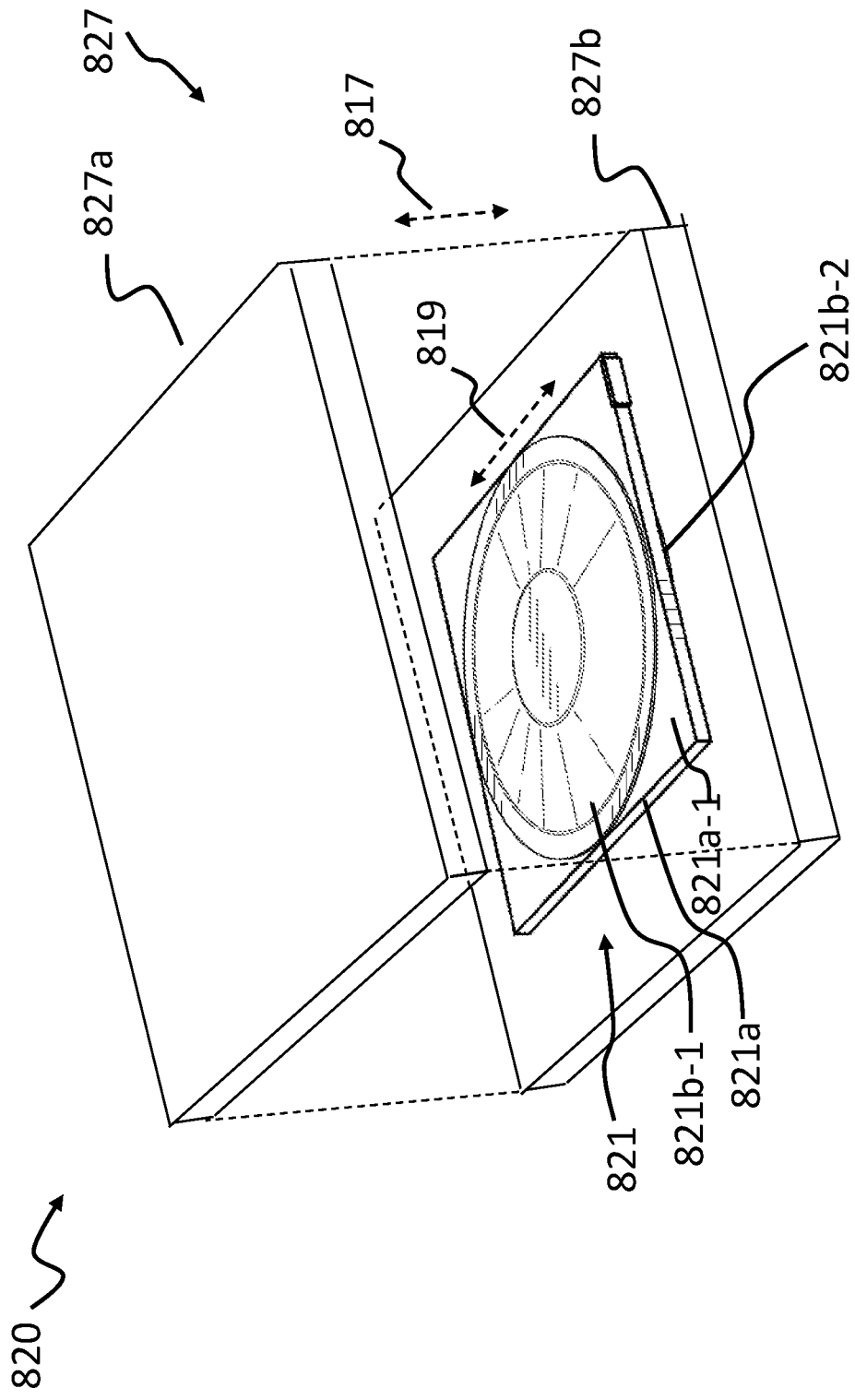
FIG. 10 depicts a haptic actuator assembly with a haptic actuator and a pre-load device, according to an embodiment hereof.

FIG. 10 depicts a partially exploded view of a haptic actuator assembly 820 that is an embodiment of any of the haptic actuator assemblies 120 through 520. The haptic actuator assembly includes a haptic actuator 821 and a pre-load device 827. In an embodiment, the haptic actuator 821 may be similar to the haptic actuator 621, and may include a layer 821*a* of piezoelectric material that is configured to generate strain along an axis 819 that is parallel to a planar surface 821*a*-1 of the layer 821*a*. The haptic actuator assembly 820 further includes a displacement conversion device that includes a first disc 821*b*-1 and a second disc 821*b*-2. Similar to the displacement conversion device 621*b*-1/621*b*-2, each of the first disc 821*b*-1 and the second disc 821*b*-2 may be a metal layer that forms a truncated cone (also referred to as a cymbal) with a respective surface of the layer 821*a* of piezoelectric material. In an embodiment, the pre-load device 827 includes a first component 827*a* and a second component 827*b* that are configured to generate a pre-load in the form of a compressive load that opposes expansion of the haptic actuator 821 along an axis 817 that is perpendicular to or substantially perpendicular to the planar surface 821*a*-1 of the layer 821*a*, and thus opposes expansion of the haptic actuator assembly 820 along the axis 817 (axis 819 may be referred to as a parallel axis, while axis 817 may be referred to as a perpendicular axis).

In an embodiment, the first component 827*a* and the second component 827*b* may be configured to generate a pre-load through a magnetic force that attracts the first component 827*a* and the second component 827*b* to each other. In an embodiment, the first component 827*a* and the second component 827*b* may be configured to generate a pre-load, in the form of a compressive load on the haptic actuator 821, which is in a range of 2 N to 4 N. The magnetic force may be created between two permanent magnets, between a permanent magnet and a ferromagnetic material, between a permanent magnet and an electromagnet, or in some other manner.

FIG. 11A illustrates an embodiment in which the pre-load, or more specifically a compressive load, is created by two permanent magnets. More specifically, the figure illustrates a haptic actuator assembly 920 that is an embodiment of the haptic actuator assembly 820. The haptic actuator assembly 920 includes a haptic actuator 921, which may be the same or similar to the haptic actuator 821, and a pre-load device 927. The pre-load device 927 may be an embodiment of the pre-load device 827, and includes a first component 927*a* and a second component 927*b* that are configured to generate a magnetic force that attracts the first component 927*a* and the second component 927*b* to each other in order to generate the compressive load. In the embodiment of FIG. 11A, each of the first component 927*a* and the second component 927*b* is a permanent magnet. In an embodiment, each of the permanent magnets that comprises the first component 927*a* and the second component 927*b* may be embedded in a substrate, such as a plastic substrate. For instance, the first component 927*a* may be embedded in a substrate 929*a*, which may in turn be in direct contact the haptic actuator 921 (e.g., with a first interface surface of the haptic actuator 921). The second component 927*b* may be embedded in a substrate 929*b*, which may in turn also be in direct contact with the haptic actuator 921 (e.g., with a second interface surface of the haptic actuator 921). In another embodiment, the substrates 929*a*, 929*b* may be omitted, and the first component 927*a* may itself be in direct contact with the haptic actuator, while the second component 927*b* may also itself be in direct contact with the haptic actuator.

In an embodiment, the permanent magnets forming the first component 927*a* and the second component 927*b* may each have a high magnetic strength, but still have a thin profile, in order to keep a low overall thickness for the haptic actuator assembly 920. For instance, the permanent magnets forming the first component 927a and the second component 927b may each have a strength of at least 1 milliTesla (mT) or 1000 Gauss, and have a thickness that is in a range of 1 mm to 2 mm. In some cases, each of the first component 927a and the second component 927b may be a neodymium magnet. In some cases, each of the first component 927a and the second component 927b may be an AlNiCo magnet. The first component 927a and the second component 927b may have the same shape (e.g., rectangular or circular shape), or may have different shapes. In some instances, the first component 927a and the second component 927b may each be rectangular, and may have a length and a width that are each in a range of 9 mm to 25 mm.

FIG. 11A further illustrates a power source 940 that may provide power to the haptic actuator 921. The power source 940 may be controlled by a control unit 930 to provide a drive signal, such as a voltage signal or a drive signal, to electrodes 921c-1, 921c-2 of the haptic actuator assembly 920. In an embodiment, the control unit 930 may control the power source 940 to provide a sinusoidal drive signal to the haptic actuator assembly 920, which may cause the haptic actuator 921 to output an oscillating displacement, such as a vibration, along an axis 917, wherein the axis 917 is perpendicular to or substantially perpendicular to a planar surface of a layer 921a of piezoelectric material of the haptic actuator 921. In an embodiment, the sinusoidal drive signal may have a peak-to-peak amplitude that is in a range of, e.g., 60 V to 120 V, and a frequency that is in a range of 50 Hz to 200 Hz. The pre-load device 927 may generate a compressive load that is in a range of, e.g., 2 N to 4 N to oppose expansion, or more generally displacement, by the haptic actuator 921 along the axis 917.

FIG. 11B illustrates an embodiment in which the pre-load, or more specifically a compressive load, is created by a permanent magnet and an electromagnet. More specifically, the figure illustrates a haptic actuator assembly 1020 that is an embodiment of the haptic actuator assembly 820. The haptic actuator assembly 1020 includes a haptic actuator 1021, which may be the same or similar to the haptic actuator 821, and a pre-load device 1027. The pre-load device 1027 may be an embodiment of the pre-load device 827, and includes a first component 1027a and a second component 1027b that are configured to generate one or more magnetic forces that attract the first component 1027a and the second component 1027b to each other in order to generate the compressive load. In the embodiment of FIG. 11B, the first component 1027a is a permanent magnet, and the second component 1027b is an electromagnet. More specifically, the second component 1027b may be a conductive coil that becomes an electromagnet when an electrical current is passed through the conductive coil. Similar to the embodiment of FIG. 11A, the first component 1027a and the second component 1027b may be embedded in respective substrates, such as substrates 1029a and 1029b. In another embodiment, the substrates 1029a, 1029b may be omitted.

In an embodiment, the first component 1027a may be similar to the first component 927a. For instance, the first component 1027a may be a neodymium magnet with a strength of at least 1000 Gauss. In an embodiment, the second component 1027b may be an electromagnet formed by a copper coil or other conductive coil. The conductive coil may have a thickness that is less than 10 mm (e.g., in a range of 1 mm to 2 mm). The conductive coil may form a circular shape, a square shape, or any other shape. In some cases, the conductive coil may be formed via a lithographic process.

FIG. 11B further illustrates a power source 1040 that provides power to the haptic actuator assembly 1020. The power source 1040 may be controlled by a control unit 1030 to provide a first drive signal to electrodes 1021c-1, 1021c-2 of the haptic actuator 1021, and to provide a second drive signal to the electromagnet formed by the second component 1027b. In an embodiment, the first drive signal may be, e.g., a sinusoidal drive signal, while the second drive signal may be a direct current (DC) signal. The control unit 1030 may be configured to control an amplitude of the DC signal in order to control a strength of a magnetic field generated by the electromagnet that is formed by second component 1027b. In an embodiment, the control unit 1030 may be configured to determine what amplitude of the DC signal will cause the electromagnet of the second component 1027b to generate a magnetic field having the same strength as a magnetic field generated by the permanent magnet of the first component 1027a.

In an embodiment, the control unit 1030 may be configured to activate and deactivate the electromagnet of the second component 1027b. The electromagnet may be activated by providing power (e.g., electrical current) to the conductive coil forming the second component 1027b, and may be deactivated by stopping power to the conductive coil.

In an embodiment, the control unit 1030 may deactivate the electromagnet formed by the second component 1027b in order to achieve a braking function that dampens any residual oscillation (also referred to as a residual vibration) of the haptic actuator 1021. For instance, after a drive signal to the electrodes 1021c-1, 1021c-2 ends, the haptic actuator 1021 may continue to oscillate along the axis 1017 (e.g., an axis perpendicular to a planar surface of a layer 1021a of piezoelectric material of the haptic actuator 1021), due to inertia of various components of the haptic actuator 1021, such as inertia of the components of a displacement conversion device thereof. Although the residual oscillation may ultimately be dissipated by friction, it may still be undesirable to rely on such dissipation when the drive signal is intended to create a crisp and short haptic effect.

In an embodiment, deactivating the electromagnet formed by the second component 1027b may counteract the residual oscillation, by reducing a force associated with the residual oscillation, and/or by absorbing kinetic energy from the residual oscillation. More specifically, when the electromagnet in FIG. 11B is deactivated, the force of attraction between the first component 1027a and the second component 1027b may cease. As a result, there is no longer a pre-load on the haptic actuator 1021. The absence of the pre-load may cause any force that accompanies the residual oscillation to be converted in whole or in part to more displacement (relative to if the pre-load were present). The force accompanying the residual oscillation may thus decrease. Thus, a user's perception of the residual oscillation may likewise decrease or disappear, which may allow the corresponding haptic effect that preceded the residual oscillation to feel shorter and more crisp. Further, because the residual oscillation has decreased in force, it may also be dissipated or otherwise stopped more quickly.

Additionally, if the second component 1027b is a conductive coil that forms an electromagnet, then when the electromagnet is deactivated, the conductive coil may behave like a generator that absorbs kinetic energy of the residual oscillation and converts it into electrical energy.

More specifically, the residual oscillation of the haptic actuator 1021 along an axis 1017 may cause the permanent magnet of the first component 1027a to oscillate between moving toward the conductive coil of the second component 1027b and moving away from the conductive coil, which may vary a magnetic flux through the conductive coil. The conductive coil may generate electrical energy from the varying magnetic flux, and thus effectively absorb the kinetic energy of the residual oscillation. Stated differently, the varying magnetic flux may cause the conductive coil to generate an electrical current, which may in turn generate a magnetic field that opposes the movement of the permanent magnet of the first component 1027a, and that opposes the residual oscillation.

In an embodiment, the control unit 1030 may deactivate the electromagnet formed by the second component 1027b at the same time that a drive signal to the electrodes 1021c-1, 1021c-2 is stopped or otherwise ends. For instance, the drive signal may be retrieved from a storage device, and may have a defined duration. In such an instance, the electromagnet may be deactivated at the same time that the defined duration of the drive signal expires. In a more specific example, the control unit 1030 may stop a DC signal or other drive signal to a conductive coil of the second component 1027b at the same time that the drive signal to the haptic actuator 1021 ends. In an embodiment, the control unit 1030 may deactivate the electromagnet formed by the second component 1027b slightly before or slightly after the drive signal to the haptic actuator 1021 ends.

In an embodiment, the conductive coil of the second component 1027b may be used to harvest energy independently of any braking functionality. More specifically, the conductive coil may be used to harvest energy when the haptic actuator 1021, and more generally the haptic actuator assembly 1020, is not being used to generate a haptic effect. The energy may be harvested from an external force experienced by the haptic actuator assembly 1020, such as an external force from a user, or more generally from an external environment of the haptic actuator assembly 1020. For instance, the haptic actuator assembly 1020 may be incorporated into a haptic-enabled device (e.g., device 100) being carried by a user as the user is walking. The haptic-enabled device may be, e.g., carried in the user's hand as the user swings his or her hand back and forth. The user's swinging motion may exert forces on the haptic actuator assembly 1020 that causes components thereof to move. For instance, the external forces from the user's swinging motion may place stresses on the haptic actuator 1021 and on the first and second components 1027a, 1027b of the pre-load device, which may cause stretching or contraction of those components along the axis 1017. As a result, the permanent magnet of the first component 1027a may alternate between moving toward the conductive coil of the second component 1027b, and moving away from the conductive coil. This relative motion between the permanent magnet and the conductive coil may cause magnetic flux through the conductive coil to change, which causes an electrical current to be generated by the conductive coil. Thus, the conductive coil forming the second component 1027b may be used to harvest energy from external forces received by the haptic actuator assembly 1020. In an embodiment, the power source 1040 may include a battery or other energy storage device that is configured to store energy that is harvested by the conductive coil. For instance, the electrical current that is generated by the conductive coil of the second component 1027b may be rectified and used to increase an amount of charge stored in an energy storage device of the power source 1040.

Figure 11C:
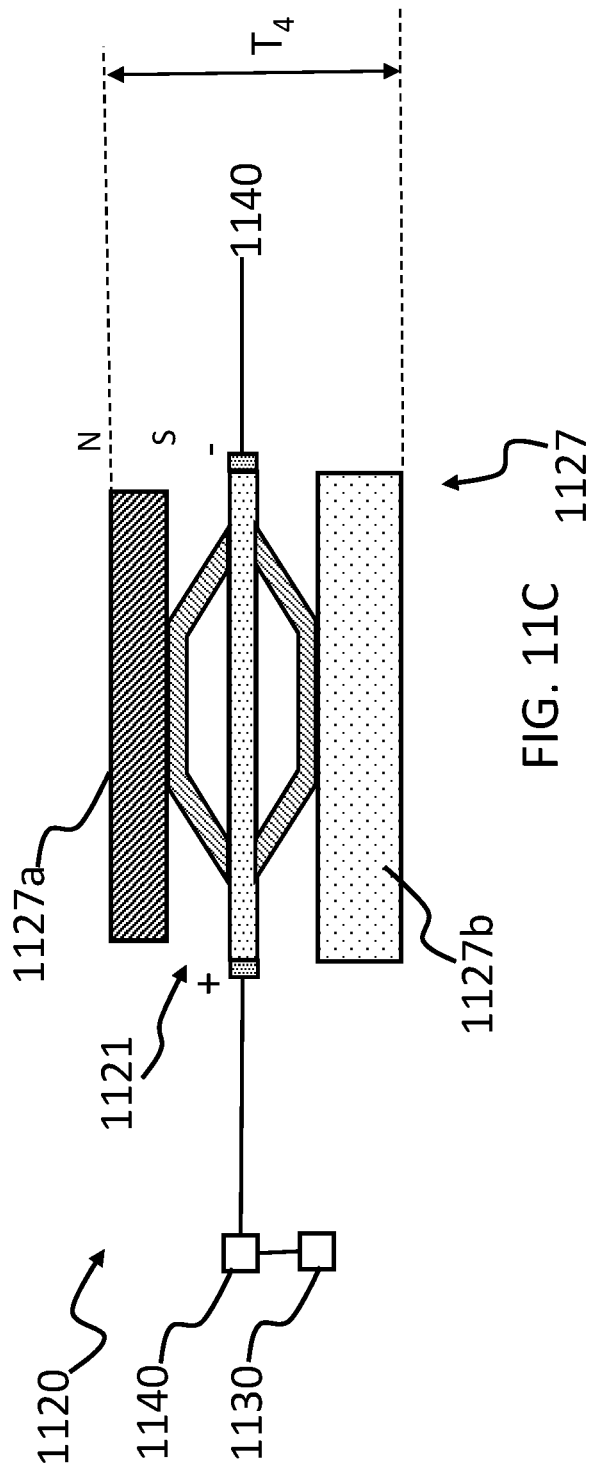
FIG. 11C depicts a haptic actuator assembly having a pre-load device comprising a permanent magnet and a ferromagnetic component, according to an embodiment hereof.

FIG. 11C illustrates an embodiment in which the pre-load, or more specifically a compressive load, is created by a permanent magnet and a ferromagnetic component, such as a layer of ferromagnetic material. More specifically, the figure illustrates a haptic actuator assembly 1120 that is an embodiment of the haptic actuator assembly 820. The haptic actuator assembly 1120 includes a haptic actuator 1121, which may be the same or similar to the haptic actuator 821, and a pre-load device 1127. The haptic actuator 1121 may be driven by a power source 1040, which may be controlled by a control unit 1130 to generate a drive signal. The pre-load device 1127 may be an embodiment of the pre-load device 827, and includes a first component 1127a and a second component 1127b that are configured to generate a magnetic force that attracts the first component 1127a and the second component 1127b to each other in order to generate the compressive load. In the embodiment of FIG. 11C, the first component 1127a is a permanent magnet, such as a neodymium magnet, and the second component 1127b is a layer of ferromagnetic material. In an embodiment, the ferromagnetic material forming the second component 1127b may be one of iron, nickel, cobalt, or an alloy comprising one or more of those materials. In an embodiment, the layer of ferromagnetic material forming the second component 1127b may have a circular shape, a rectangular shape, or any other shape. In an embodiment, the layer of ferromagnetic material forming the second component 1127b may have a thickness that is in a range of 1 mm to 10 mm. Moreover, FIG. 11C illustrates an embodiment in which the first component 1127a and the second component 1127b are not embedded within another substrate, such as a plastic substrate. In another embodiment, the first component 1127a and the second component 1127b may be included in a plastic substrate.

In an embodiment, an overall thickness, such as $T_4$ in FIG. 11C, of the haptic actuator assembly 920/1020/1120 may be in a range of 2 mm to 10 mm, wherein the thickness of the haptic actuator assembly includes at least a thickness of the first component 927a/1027a/1127a of the pre-load device, a distance from the first component 927a/1027a/1127a to the second component 927b/1027b/1127b of the pre-load device, and a thickness of the second component 927b/1027b/1127b.

In an embodiment, when a voltage difference of, e.g., 50 V to 100 V is applied to two electrodes of a haptic actuator 921/1021/1121, and when the compressive load or other pre-load is applied to the haptic actuator 921/1021/1121 by the pre-load device 927/1027/1127, the haptic actuator 921/1021/1121 outputs a displacement (relative to a baseline state in which no voltage difference is being applied to the haptic actuator 921/1021/1121) that is in a range of 1 μm to 15 μm, and the haptic actuator assembly 920/1020/1120 is configured to output a force along the axis 917/1017/1117 that is in a range of 2N to 10 N.

In an embodiment, when the voltage difference being applied to the haptic actuator 921/1021/1121 is, e.g., between 50 V and 100 V, and when the compressive load is applied to the haptic actuator 921/1021/1121 by the pre-load device 927/1027/1127, the haptic actuator outputs a displacement (relative to the baseline state) that is in a range of 25% to 50% of a defined nominal displacement for the haptic actuator 921/1021/1121, wherein the nominal displacement may be specific to the voltage difference. Further in this example, the haptic actuator assembly 920/1020/1120 may be configured to output a force along the axis 917/

1017/1117 that is in a range of 50% to 75% of a defined blocking force for the haptic actuator 921/1021/1121, wherein the blocking force may also be specific to the voltage difference In an embodiment, the control unit 130/930/1030/1130 may be configured to generate a drive signal for the haptic actuator 121/921/1021/1121 that is at a resonant frequency of the respective haptic actuator 121/921/1021/1121. In an embodiment, the drive signal may have an amplitude (e.g., peak-to-peak amplitude) that is below a defined threshold, in order to further avoid generating excessive force or displacement that would damage the haptic actuator, even with the presence of a pre-load.

In an embodiment, the control unit 130/330/930/1030/1130 may be configured to generate a drive signal with a frequency content that includes at least a first frequency that is a resonant frequency of the haptic actuator 121/921/1021/1121 and a second frequency that is not the resonant frequency of the haptic actuator 121/921/1021/1121. In other words, the drive signal may include a first component having the first frequency and a second component having the second frequency. In some cases, the first component and the second component may be the only frequencies of the drive signal. The control unit 130/930/1030/1130 may cause the first component of the drive signal to have a first amplitude that is below the defined threshold (because the first component has the resonant frequency), and may cause the second component to have a second amplitude that is higher than the first amplitude and above the defined threshold.

Figure 11D:
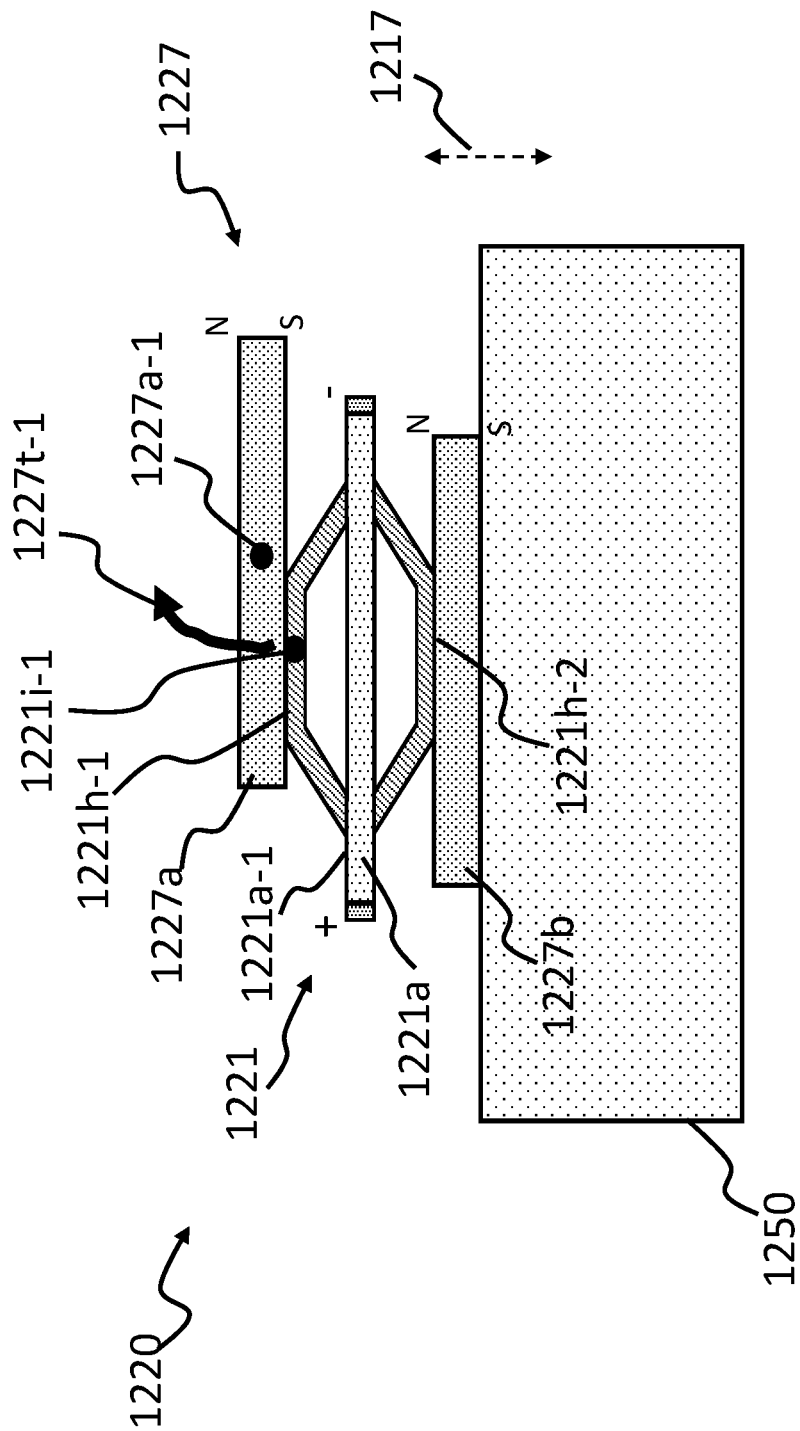
FIG. 11D depicts a haptic actuator assembly having a pre-load device that is off-center relative to a haptic actuator of the assembly, according to an embodiment hereof.

In an embodiment, a haptic actuator assembly may include a pre-load device that is off-center relative to a haptic actuator of the assembly. In such an embodiment, when the haptic actuator generates displacement, such as by expanding outward, the haptic actuator may apply a torque to the pre-load device. The torque may rotate the pre-load device relative to the haptic actuator, and may cause the pre-load device to exhibit a wobbling motion. For instance, FIG. 11D depicts a haptic actuator assembly 1220 that includes a haptic actuator 1221 and a pre-load device 1227. The haptic actuator 1221 may include a layer 1221a of piezoelectric material, and may be configured to output displacement along a perpendicular axis 1217, wherein the perpendicular axis 1217 is perpendicular to a planar surface 1221a-1 of the layer 1221a. The pre-load device 1227 may include a first component 1227a and a second component 1227b that are configured to generate a magnetic force that attracts the first component 1227a and the second component 1227b to each other. For instance, both the first component 1227a and the second component 1227b may be permanent magnets. The first component 1227a and the second component 1227b may be disposed on a first outer surface 1221h-1 and a second outer surface 1221h-2, respectively, of the haptic actuator 1221 (the first outer surface 1221h-1 and the second outer surface 1221h-2 may be opposing surfaces of the haptic actuator 1221). In some cases, the first component 1227a and the second component 1227b may be in direct contact with and bonded to the first outer surface 1221h-1 and the second outer surface 1221h-2, respectively. In an embodiment, the first component 1227a may be in contact with or otherwise adjacent to, e.g., a back panel of a haptic-enabled device, while the second component 1227b may be mounted to a mounting component 1250 that is more rigid and/or has more mass than the back panel. In such an embodiment, the mounting component 1250 may direct displacement from the haptic actuator 1221 and from the assembly 1220 toward moving the back panel rather than moving the mounting component 1250.

As illustrated in FIG. 11D, the first component 1227a may be off-center relative to the first outer surface 1221h-1 of the haptic actuator 1221. More specifically, the first component 1227a may be mounted at a position in which a center of mass 1227a-1 of the first component 1227a is offset from a center 1221i-1 of the first outer surface 1221h-1. In other words, the center of mass 1227a-1 and the center 1227i-1 of the first outer surface 1221h-1 do not line up along the perpendicular axis 1217. In such an instance, when the haptic actuator 1221 expands or otherwise generates displacement along the perpendicular axis 1217, the haptic actuator 1221 may exert a force against the first component 1227a that is off-center relative to the center of mass 1227a-1 of the first component 1227a, and thus may generate a torque (also referred to as a moment) about the center of mass 1227a-1 of the first component 1227a. The first component 1227a may thus exhibit some rotation about its center of mass 1227a-1 when being pushed by the haptic actuator 1221. Stated differently, by placing the first component 1227a off-center relative to a center 1221i-1 of the first outer surface 1221h-1, part of the first component 1227a may act as a lever when being pushed by the haptic actuator 1221. This lever configuration may be able to enhance a haptic effect generated by the movement of the haptic actuator 1221 and of the first component 1227a.

In the embodiment of FIG. 11D, the second component 1227b is centered relative to the second outer surface 1221h-2 of the haptic actuator 1221. In another embodiment, the second component 1227b is also off-center relative to a center of the second outer surface 1221h-2 of the haptic actuator 1221.

Additional discussion of various embodiments is presented below:

Embodiment 1 relates to a haptic actuator assembly, comprising a haptic actuator and a pre-load device. The haptic actuator is configured to generate a displacement along a first axis, wherein the haptic actuator is a piezoelectric actuator.

The pre-load device is adjacent to the haptic actuator and configured to generate a compressive load on the haptic actuator along the first axis, and includes a first component and a second component that are disposed on opposing surfaces of the haptic actuator, and are configured to generate a magnetic force that attracts the first component and the second component to each other in order to generate the compressive load on the haptic actuator along the first axis. The first component is a permanent magnet, and the second component is at least one of another permanent magnet, an electromagnet, or a ferromagnetic component that comprises ferromagnetic material.

Embodiment 2 is a haptic actuator assembly, comprising: a haptic actuator and a pre-load device. The haptic actuator includes a layer of piezoelectric material configured to generate strain along a parallel axis, the parallel axis being parallel to a planar surface of the layer, and includes a displacement conversion device configured to convert the strain of the layer of piezoelectric material along the parallel axis to expansion or contraction of the haptic actuator along a perpendicular axis, the perpendicular axis being perpendicular to the planar surface of the layer. The expansion or contraction of the haptic actuator is configured to generate a displacement of the haptic actuator along the perpendicular axis.

The pre-load device is adjacent to the haptic actuator and is configured to generate a compressive load on the haptic actuator along the perpendicular axis, and includes a first component and a second component that are disposed on opposing surfaces of the haptic actuator, and are configured to generate a magnetic force that attracts the first component and the second component to each other in order to generate the compressive load on the haptic actuator along the perpendicular axis. The first component is a permanent magnet, and the second component is at least one of another permanent magnet, an electromagnet, or a ferromagnetic component that comprises ferromagnetic material.

Embodiment 3 includes the haptic actuator assembly of embodiment 2, wherein the displacement conversion device of the haptic actuator is a displacement amplification device configured to convert a displacement output by the layer of piezoelectric material along the parallel axis due to the strain thereof to a greater displacement of the haptic actuator along the perpendicular axis.

Embodiment 4 includes the haptic actuator assembly of embodiment 3, wherein the displacement amplification device of the haptic actuator includes a lever device configured to convert the displacement along the parallel axis to the greater displacement along the perpendicular axis.

Embodiment 5 includes the haptic actuator assembly of embodiment 4, wherein the lever device of the haptic actuator includes a first disc and a second disc disposed on respective opposite planar surfaces of the layer of piezoelectric material, wherein each disc of the first disc and the second disc forms a truncated cone with a respective planar surface of the layer of piezoelectric material.

Embodiment 6 includes the haptic actuator assembly of any one of embodiments 2-5, wherein the second component of the pre-load device is an electromagnet formed from a conductive coil.

Embodiment 7 includes the haptic actuator assembly of embodiment 6, wherein the conductive coil has a thickness that is in a range of 1 mm to 2 mm.

Embodiment 8 includes the haptic actuator assembly of any one of embodiments 2-5, wherein the permanent magnet of the pre-load device is a first permanent magnet, and wherein the second component of the pre-load device is a second permanent magnet.

Embodiment 9 includes the haptic actuator assembly of embodiment 8, wherein each permanent magnet of the first permanent magnet and the second permanent magnet of the pre-load device has a thickness that is in a range of 0.5 mm to 2 mm.

Embodiment 10 includes the haptic actuator assembly of any one of embodiments 2-9, wherein the permanent magnet has a strength of at least 1000 Gauss.

Embodiment 11 includes the haptic actuator assembly of any one of embodiments 2-10, wherein the second component of the pre-load device is the ferromagnetic component, and wherein the ferromagnetic component is a metal layer.

Embodiment 12 includes the haptic actuator assembly of any one of embodiments 2-11, wherein the permanent magnet is a neodymium magnet.

Embodiment 13 includes the haptic actuator assembly of any one of embodiments 2-12, wherein the compressive load along the perpendicular axis generated by the first component and the second component of the pre-load device is in a range of 2 N to 4 N.

Embodiment 14 includes the haptic actuator assembly of any one of embodiments 2-13, wherein a thickness of the haptic actuator assembly is in a range of 1 mm to 5 mm, and wherein the thickness of the haptic actuator assembly includes at least a thickness of the first component, a distance from the first component to the second component, and a thickness of the second component.

Embodiment 15 includes the haptic actuator assembly of any one of embodiments 2-14, wherein the haptic actuator further comprises at least two electrodes attached to or embedded within the layer of piezoelectric material and configured to create a voltage difference along the perpendicular axis, wherein the layer of piezoelectric material is configured to contract along the parallel axis in response to the voltage difference along the perpendicular axis.

Embodiment 16 includes the haptic actuator assembly of embodiment 15, wherein when the voltage difference between the at least two electrodes is between 50 V and 100 V and when the compressive load is applied to the haptic actuator by the pre-load device, the haptic actuator outputs a displacement along the perpendicular axis, relative to a baseline state in which there is no voltage difference between the at least two electrodes, that is in a range of 1 μm to 15 μm, and the haptic actuator assembly is configured to output a force along the perpendicular axis that is in a range of 2N to 10 N.

Embodiment 17 includes the haptic actuator assembly of embodiment 15 or 16, wherein when the voltage difference between the at least two electrodes is between 50 V and 100 V and when the compressive load is applied to the haptic actuator by the pre-load device, the haptic actuator assembly outputs a displacement along the perpendicular axis, relative to a baseline state in which there is no voltage difference between the at least two electrodes, that is in a range of 25% to 50% of a defined nominal displacement that is for the haptic actuator and associated with the voltage difference, and the haptic actuator assembly is configured to output a force along the perpendicular axis that is in a range of 50% to 75% of a defined blocking force that is for the haptic actuator and associated with the voltage difference.

Embodiment 18 includes the haptic actuator assembly of any one of embodiments 2-17, wherein the layer of piezoelectric material is a layer of lead zirconate titanate (PZT) material.

Embodiment 19 includes the haptic actuator assembly of any one of embodiments 2-17, wherein the layer of piezoelectric material is a layer of polymer.

Embodiment 20 includes the haptic actuator assembly of any one of embodiments 2-19, wherein the layer of piezoelectric material comprises a stack of sub-layers of piezoelectric material, wherein each sub-layer of piezoelectric material is directly between two electrodes configured to generate a voltage difference across the sub-layer.

Embodiment 21 includes the haptic actuator assembly of any one of embodiments 2-20, wherein at least one component of the first component or the second component of the pre-load device is off-center relative to a center of a respective surface of the opposing surfaces, such that a center of mass of the at least one component and the center of the respective surface do not line up along the perpendicular axis.

Embodiment 22 relates to a haptic-enabled device, comprising a housing, a power source, and a haptic actuator assembly configured to generate a haptic effect at an outer surface of the housing, the haptic actuator assembly comprising a haptic actuator and a pre-load device.

The haptic actuator includes a layer of piezoelectric material configured to generate strain along a parallel axis, the parallel axis being parallel to a planar surface of the layer, at least two electrodes attached to or embedded within the layer of piezoelectric material, and a displacement conversion device configured to convert the strain of the layer of piezoelectric material along the parallel axis to expansion or contraction of the haptic actuator along a perpendicular axis, the perpendicular axis being perpendicular to the planar surface of the layer, wherein the expansion or contraction of the haptic actuator is configured to generate a displacement of the haptic actuator along the perpendicular axis.

The pre-load device is adjacent to the haptic actuator and configured to generate a compressive load on the haptic actuator along the perpendicular axis, the pre-load device including a first component and a second component that are disposed on opposing surfaces of the haptic actuator, and are configured to generate a magnetic force that attracts the first component and the second component to each other in order to generate the compressive load on the haptic actuator along the perpendicular axis. The first component is a permanent magnet, and the second component is at least one of another permanent magnet, an electromagnet, or a ferromagnetic component that comprises ferromagnetic material.

The haptic-enabled device further comprises a control unit configured to control the power source to provide power to the at least two electrodes of the haptic actuator.

Embodiment 23 includes the haptic-enabled device of embodiment 22, wherein any compressive load applied to the haptic actuator assembly by the housing of the haptic-enabled device is less than 1 N.

Embodiment 24 includes the haptic-enabled device of embodiment 22 or 23, further comprising a touch screen device that forms a first side of the housing, wherein the housing comprises a back panel that forms a second and opposite side of the housing, wherein the haptic actuator assembly is disposed at the second side of the housing, so that force generated by the haptic actuator assembly is exerted against the second side of the housing.

Embodiment 25 includes the haptic-enabled device of any one of embodiments 22-24, wherein the haptic actuator assembly has a thickness that is in a range of 2 mm to 10 mm.

Embodiment 26 includes the haptic-enabled device of any one of embodiments 22-25, wherein the second component is an electromagnet, and wherein the control unit is configured to activate and deactivate the electromagnet.

Embodiment 27 includes the haptic-enabled device of embodiment 26, wherein the control unit is configured to control the power source to provide a drive signal to the haptic actuator of the haptic actuator assembly, to activate the electromagnet when the drive signal is being provided to the haptic actuator, in order to cause the pre-load device to apply the compressive load to the haptic actuator, and to deactivate the electromagnet when the drive signal to the haptic actuator ends.

Embodiment 28 includes the haptic-enabled device of embodiment 26 or 27, wherein the drive signal is a periodic signal having a defined duration, wherein the electromagnet is activated during the defined duration, and is deactivated when the defined duration expires.

Embodiment 29 includes the haptic-enabled device of any one of embodiments 22-28, wherein the electromagnet comprises a conductive coil, and wherein when the electromagnet is deactivated, the conductive coil and the permanent magnet are movable relative to each other by an external force applied to the haptic-enabled device, wherein the conductive coil is configured to harvest power from the relative movement of the permanent magnet and the conductive coil, and wherein the power source comprises a power storage device configured to store the power that is harvested by the conductive coil.

While various embodiments have been described above, it should be understood that they have been presented only as illustrations and examples of the present invention, and not by way of limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the appended claims and their equivalents. It will also be understood that each feature of each embodiment discussed herein, and of each reference cited herein, can be used in combination with the features of any other embodiment. All patents and publications discussed herein are incorporated by reference herein in their entirety.

What is claimed is:

1. A haptic actuator assembly, comprising:
a haptic actuator configured to generate a displacement along a first axis, wherein the haptic actuator is a piezoelectric actuator; and
a pre-load device adjacent to the haptic actuator and configured to generate a compressive load on the haptic actuator along the first axis, the pre-load device including
a first component and a second component that are disposed on opposing surfaces of the haptic actuator, and are configured to generate a magnetic force that attracts the first component and the second component to each other in order to generate the compressive load on the haptic actuator along the first axis,
wherein the first component is a permanent magnet, and
wherein the second component is at least one of another permanent magnet, an electromagnet, or a ferromagnetic component that comprises ferromagnetic material.

2. A haptic actuator assembly, comprising:
a haptic actuator including
a layer of piezoelectric material configured to generate strain along a parallel axis, the parallel axis being parallel to a planar surface of the layer, and
a displacement conversion device configured to convert the strain of the layer of piezoelectric material along the parallel axis to expansion or contraction of the haptic actuator along a perpendicular axis, the perpendicular axis being perpendicular to the planar surface of the layer,
wherein the expansion or contraction of the haptic actuator is configured to generate a displacement of the haptic actuator along the perpendicular axis; and
a pre-load device adjacent to the haptic actuator and configured to generate a compressive load on the haptic actuator along the perpendicular axis, the pre-load device including
a first component and a second component that are disposed on opposing surfaces of the haptic actuator, and are configured to generate a magnetic force that attracts the first component and the second component to each other in order to generate the compressive load on the haptic actuator along the perpendicular axis,
wherein the first component is a permanent magnet, and wherein the second component is at least one of another permanent magnet, an electromagnet, or a ferromagnetic component that comprises ferromagnetic material.

3. The haptic actuator assembly of claim 2, wherein the displacement conversion device of the haptic actuator is a displacement amplification device configured to convert a displacement output by the layer of piezoelectric material along the parallel axis due to the strain thereof to a greater displacement of the haptic actuator along the perpendicular axis.

4. The haptic actuator assembly of claim 3, wherein the displacement amplification device of the haptic actuator includes a lever device configured to convert the displacement along the parallel axis to the greater displacement along the perpendicular axis.

5. The haptic actuator assembly of claim 4, wherein the lever device of the haptic actuator includes a first disc and a second disc disposed on respective opposite planar surfaces of the layer of piezoelectric material, wherein each disc of the first disc and the second disc forms a truncated cone with a respective planar surface of the layer of piezoelectric material.

6. The haptic actuator assembly of claim 2, wherein the second component of the pre-load device is the electromagnet, and wherein the electromagnet is formed from a conductive coil.

7. The haptic actuator assembly of claim 6, wherein the conductive coil has a thickness that is in a range of 1 mm to 2 mm.

8. The haptic actuator assembly of claim 2, wherein the permanent magnet of the first component of the pre-load device is a first permanent magnet, and wherein the second component of the pre-load device is the another permanent magnet, which is a second permanent magnet.

9. The haptic actuator assembly of claim 8, wherein each permanent magnet of the first permanent magnet and the second permanent magnet of the pre-load device has a thickness that is in a range of 0.5 mm to 2 mm.

10. The haptic actuator assembly of claim 2, wherein the permanent magnet has a strength of at least 1000 Gauss.

11. The haptic actuator assembly of claim 2, wherein the second component of the pre-load device is the ferromagnetic component, and wherein the ferromagnetic component is a metal layer.

12. The haptic actuator assembly of claim 2, wherein the compressive load along the perpendicular axis generated by the first component and the second component of the pre-load device is in a range of 2 N to 4 N.

13. The haptic actuator assembly of claim 2, wherein the haptic actuator further comprises at least two electrodes attached to or embedded within the layer of piezoelectric material and configured to create a voltage difference along the perpendicular axis, wherein the layer of piezoelectric material is configured to contract along the parallel axis in response to the voltage difference along the perpendicular axis.

14. The haptic actuator assembly of claim 13, wherein when the voltage difference between the at least two electrodes is between 50 V and 100 V and when the compressive load is applied to the haptic actuator by the pre-load device, the haptic actuator outputs a displacement along the perpendicular axis, relative to a baseline state in which there is no voltage difference between the at least two electrodes, that is in a range of 1 µm to 15 µm, and the haptic actuator assembly is configured to output a force along the perpendicular axis that is in a range of 2 N to 10 N.

15. The haptic actuator assembly of claim 13, wherein when the voltage difference between the at least two electrodes is between 50 V and 100 V and when the compressive load is applied to the haptic actuator by the pre-load device, the haptic actuator assembly outputs a displacement along the perpendicular axis, relative to a baseline state in which there is no voltage difference between the at least two electrodes, that is in a range of 25% to 50% of a defined nominal displacement that is for the haptic actuator and associated with the voltage difference, and the haptic actuator assembly is configured to output a force along the perpendicular axis that is in a range of 50% to 75% of a defined blocking force that is for the haptic actuator and associated with the voltage difference.

16. The haptic actuator assembly of claim 2, wherein the layer of piezoelectric material is a layer of polymer.

17. The haptic actuator assembly of claim 2, wherein at least one component of the first component or the second component of the pre-load device is off-center relative to a center of a respective surface of the opposing surfaces, such that a center of mass of the at least one component and the center of the respective surface do not line up along the perpendicular axis.

18. A haptic-enabled device, comprising:
a housing;
a power source;
a haptic actuator assembly configured to generate a haptic effect at an outer surface of the housing, the haptic actuator assembly comprising
  a haptic actuator including
    a layer of piezoelectric material configured to generate strain along a parallel axis, the parallel axis being parallel to a planar surface of the layer,
    at least two electrodes attached to or embedded within the layer of piezoelectric material, and
    a displacement conversion device configured to convert the strain of the layer of piezoelectric material along the parallel axis to expansion or contraction of the haptic actuator along a perpendicular axis, the perpendicular axis being perpendicular to the planar surface of the layer, wherein the expansion or contraction of the haptic actuator is configured to generate a displacement of the haptic actuator along the perpendicular axis;
  a pre-load device adjacent to the haptic actuator and configured to generate a compressive load on the haptic actuator along the perpendicular axis, the pre-load device including
    a first component and a second component that are disposed on opposing surfaces of the haptic actuator, and are configured to generate a magnetic force that attracts the first component and the second component to each other in order to generate the compressive load on the haptic actuator along the perpendicular axis,
    wherein the first component is a permanent magnet, and
    wherein the second component is at least one of another permanent magnet, an electromagnet, or a ferromagnetic component that comprises ferromagnetic material; and
a control unit configured to control the power source to provide power to the at least two electrodes of the haptic actuator.

19. The haptic-enabled device of claim 18, further comprising a touch screen device that forms a first side of the housing, wherein the housing comprises a back panel that forms a second and opposite side of the housing, wherein the haptic actuator assembly is disposed at the second side of the housing, so that force generated by the haptic actuator assembly is exerted against the second side of the housing.

20. The haptic-enabled device of claim 18, wherein the second component is the electromagnet, and wherein the control unit is configured to activate and deactivate the electromagnet.

21. The haptic-enabled device of claim 20, wherein the control unit is configured
- to control the power source to provide a drive signal to the haptic actuator of the haptic actuator assembly,
- to activate the electromagnet when the drive signal is being provided to the haptic actuator, in order to cause the pre-load device to apply the compressive load to the haptic actuator, and
- to deactivate the electromagnet when the drive signal to the haptic actuator ends.

22. The haptic-enabled device of claim 21, wherein the drive signal is a periodic signal having a defined duration, wherein the electromagnet is activated during the defined duration, and is deactivated when the defined duration expires.

* * * * *